US009704379B2

(12) United States Patent
Dong et al.

(10) Patent No.: US 9,704,379 B2
(45) Date of Patent: Jul. 11, 2017

(54) SENSOR-CONTAINING ELECTRONIC DEVICE BUTTON WITH OPTIMIZED TACTILE CHARACTERISTICS

(71) Applicant: Google Inc., Mountain View, CA (US)

(72) Inventors: William Dong, Palo Alto, CA (US); Mathias Schmidt, Emeryville, CA (US); Adam Mittleman, Redwood City, CA (US)

(73) Assignee: Google Inc., Mountain View, CA (US)

( * ) Notice: Subject to any disclaimer, the term of this patent is extended or adjusted under 35 U.S.C. 154(b) by 0 days.

(21) Appl. No.: 14/713,958

(22) Filed: May 15, 2015

(65) Prior Publication Data

US 2016/0335881 A1    Nov. 17, 2016

(51) Int. Cl.
*G08B 17/107* (2006.01)
*G08B 25/12* (2006.01)
*H05K 5/03* (2006.01)

(52) U.S. Cl.
CPC ........... *G08B 25/12* (2013.01); *G08B 17/107* (2013.01); *H05K 5/03* (2013.01)

(58) Field of Classification Search
None
See application file for complete search history.

(56) References Cited

U.S. PATENT DOCUMENTS

| 4,139,756 | A * | 2/1979 | Tsen | H01H 3/12 200/330 |
| 5,450,064 | A * | 9/1995 | Williams, Jr. | G08B 25/016 340/574 |
| 8,847,772 | B2 | 9/2014 | Marks et al. | |
| 2014/0084165 | A1* | 3/2014 | Fadell | G08B 17/00 250/340 |

* cited by examiner

*Primary Examiner* — Daniell L Negron
(74) *Attorney, Agent, or Firm* — Kilpatrick Townsend & Stockton LLP

(57) ABSTRACT

According to one embodiment, a displacement control member may be operationally coupled with a selectable button of a hazard detector so that axial depression of the selectable button effects pivoting of the selectable button and the displacement control member into contact with a switch of the hazard detector. The displacement control member may be coupled with the selectable button so that a ratio of a distance from the switch to a point of user contact with the selectable button and a distance from the switch to a pivot point of the displacement control member is similar regardless of where the user contacts the selectable button. The displacement control member may equalize a user input force that is required to activate the hazard detector's switch.

15 Claims, 15 Drawing Sheets

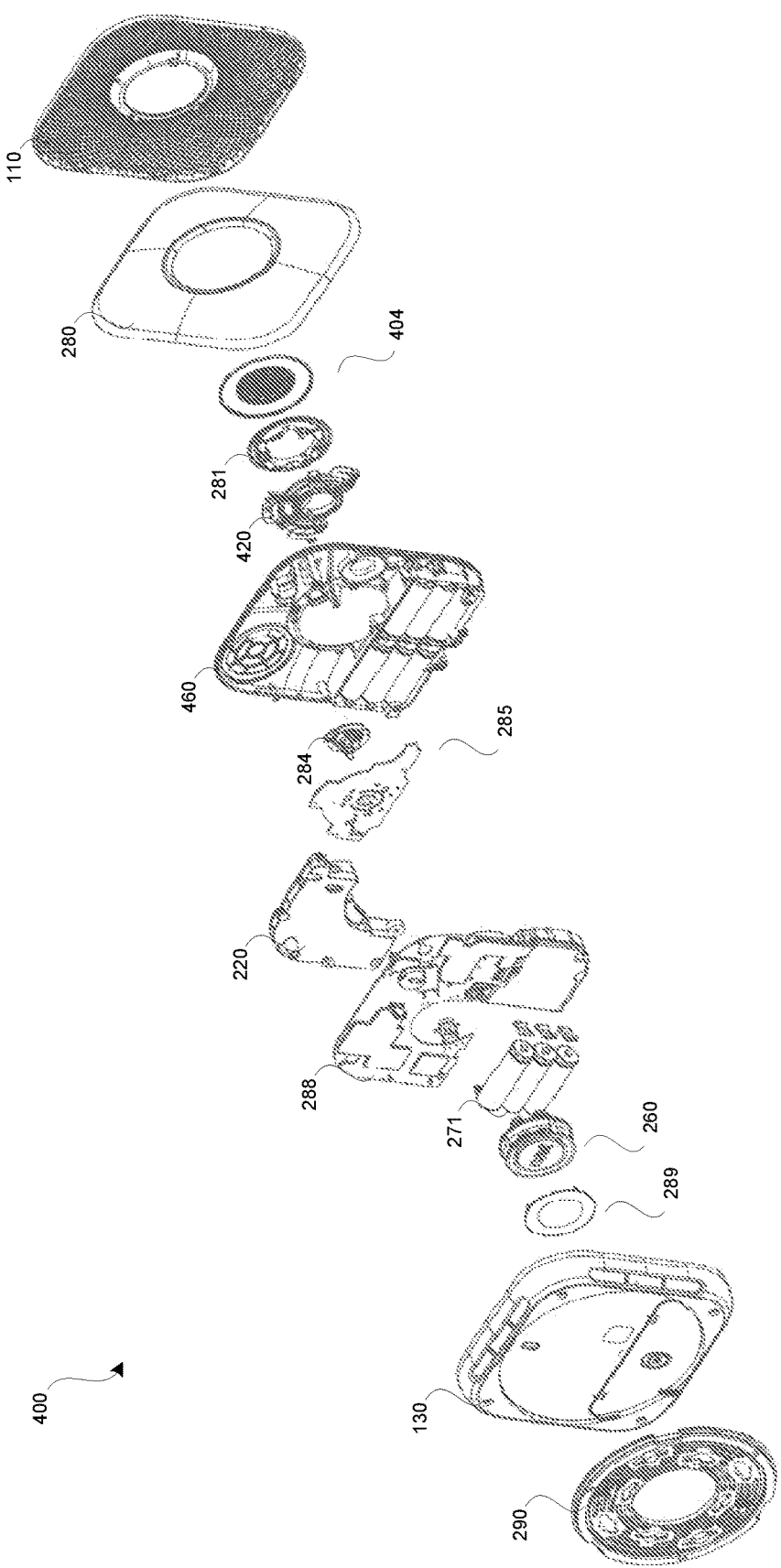

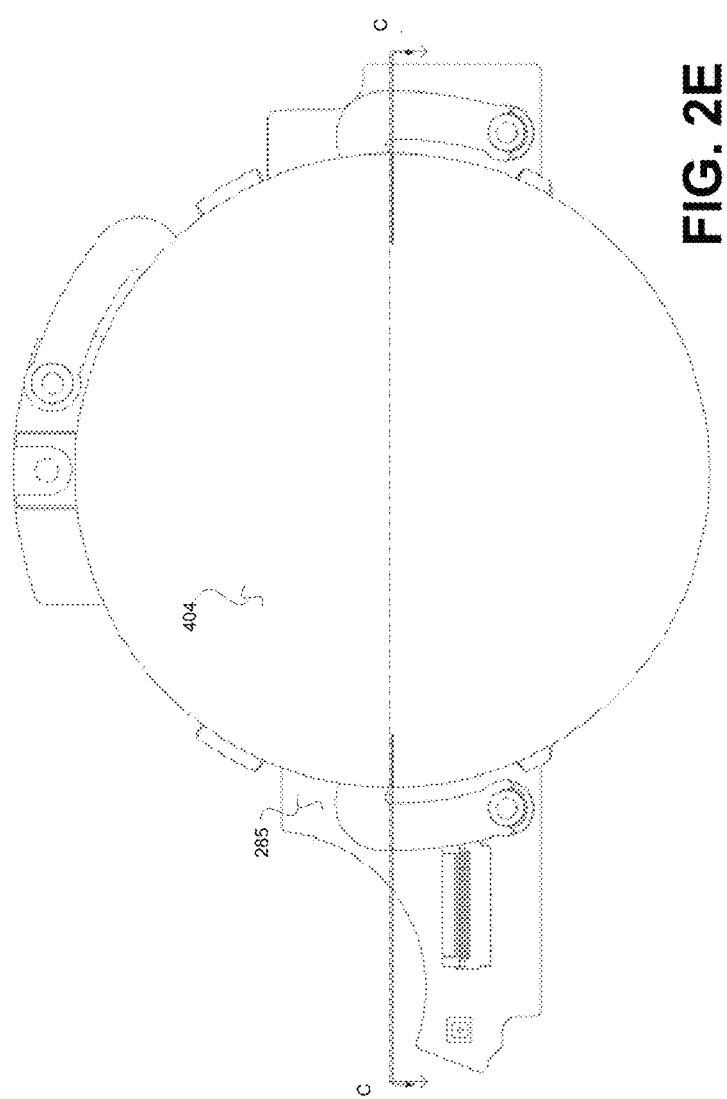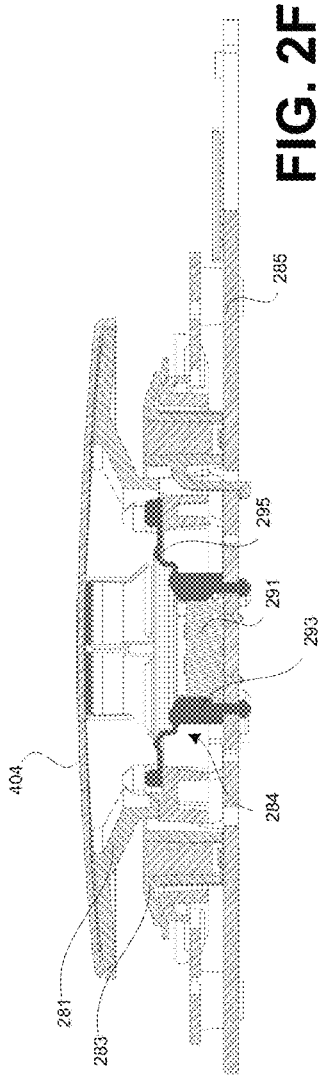
FIG. 2E
FIG. 2F

SENSOR-CONTAINING ELECTRONIC DEVICE BUTTON WITH OPTIMIZED TACTILE CHARACTERISTICS

BACKGROUND OF THE INVENTION

Homes, buildings, and other structures are required to utilize hazard detectors that detect the presence of a hazard with the home, building, or structure and that alert an occupant to a potential danger. Such hazard detectors often come with one or more buttons that may be selected or pressed to provide various inputs or commands to the hazard detector, such as silencing of an alarm. In many instances it may be desirable to enhance the tactile feel and/or feedback associated with user selection of the button. Such an enhancement may strengthen the user's experience in interacting with the hazard detector.

BRIEF SUMMARY OF THE INVENTION

Embodiments of the invention provide various hazard devices that may be used within a home, building, or structure to warn occupants of the home, building, or structure of a potential danger. According to a first aspect, a hazard detector includes a housing having an interior region within which components of the hazard detector are contained. The housing includes a plurality of openings through which air flows so as to be accessible to a hazard sensor positioned within the interior region of the housing. A selectable button is positioned on a front portion of the hazard detector to face and be selectable by a user when the hazard detector is mounted on a wall or ceiling of the building or structure. A switch is disposed within the housing and axially under the selectable button. The switch is positioned radially offset from a central axis of the selectable button and is activatable upon user selection of the selectable button. A displacement control member is disposed within the housing between the selectable button and the switch. The displacement control member is operationally coupled with the selectable button so that axial depression of the selectable button effects pivoting of the selectable button and pivoting of the displacement control member into contact with the switch. The displacement control member is configured to equalize a user input force that is required to activate the switch by being coupled with the housing and selectable button so that a ratio of a radial distance from the switch to the user input force and a radial distance from the switch to a pivot point of the displacement control member is similar or substantially the same regardless of where the user selects the selectable button. A variation of the user input force that is required to activate the switch may be less than 40%, 30%, or 25%. In an exemplary embodiment, a variation of the user input force that is required to activate the switch may be less than 20%, such as 18%.

The displacement control member includes a pivot surface that defines the pivot point and that effects pivoting of the selectable button and the displacement control member upon user selection of the selectable button. In some embodiments, the pivot surface is a radial flange that extends around a majority of an outer perimeter of the displacement control member. In other embodiments, the displacement control member includes a plurality of arms that extend radially from a central hub. In such embodiments, a radial length of at least two of the arms may be different and/or the displacement control member may include five arms that extend radially from the central hub.

The displacement control member may be coupled with the housing so that the pivot surface is radially offset from the central axis of the selectable button. The ratio of the radial distance from the switch to the user input force and from the switch to the pivot point may be between about 3:1 and 1:3, and more commonly between about 3:2 and 2:3. The displacement control member may also include one or more spring components that are coupleable with the housing and configured to bias the selectable button toward an unselected position. The displacement control member may further include a centrally located aperture that is positioned so as to not impede a proximity sensor that is disposed axially behind the displacement control member from sensing user occupancy within the building or structure.

According to another aspect, a component for a hazard detector having a selectable button and a switch disposed axially under the selectable button is provided. The switch is positioned radially offset from a central axis of the selectable button and is activatable upon user selection of the selectable button. The component is disposed within the housing between the selectable button and the switch. The component includes a displacement control member that is operationally coupleable with the selectable button so that axial depression of the selectable button effects pivoting of the selectable button and pivoting of the displacement control member into contact with the switch. The displacement control member is coupled with the housing and selectable button so that a ratio of a radial distance from the switch to a point of user contact with the selectable button and a radial distance from the switch to a pivot point of the displacement control member is such that a user input force that is required to activate the switch is relatively uniform regardless of where the user contacts the selectable button. As used herein, the input force being relatively uniform mean that a variation or deviation in the input force is less than 40% and more commonly less than 30% or 25%. In an exemplary embodiment, the variation or deviation is less than 20%.

The displacement control member includes a pivot surface that defines the pivot point that effects pivoting of the selectable button and the displacement control member upon user selection of the selectable button. In some embodiments, the pivot surface is a radial flange that extends around a majority of an outer perimeter of the displacement control member. In other embodiments, the pivot surface is defined by a plurality of arms that extend radially from a central hub. In such embodiments, a radial length of at least two of the arms is typically different. In a specific embodiment, the displacement control member includes five arms that extend radially from the central hub. The displacement control member may be coupled with the housing so that the pivot surface is radially offset from the central axis of the selectable button. The ratio of the radial distance from the switch to the user input force and from the switch to the pivot point may be between about 3:1 and 1:3, and more commonly between about 3:2 and 2:3.

According to another aspect, a method of configuring a hazard detector is provided. The method includes providing a housing having an interior region within which components of the hazard detector are contained. The housing typically includes a plurality of openings through which air flows so as to be accessible to a hazard sensor positioned within the interior region of the housing. The method also includes positioning a selectable button on a front portion of the hazard detector so as to face and be selectable by a user when the hazard detector is mounted on a wall or ceiling of the building or structure. The method further includes positioning a switch within the housing so as to be axially under the selectable button and radially offset from a central axis of the selectable button. The switch is activatable upon user selection of the selectable button. The method additionally includes positioning a displacement control member within the housing between the selectable button and the switch and coupling the displacement control member with the housing and selectable button so that axial depression of the selectable button effects pivoting of the selectable button and pivoting of the displacement control member into contact with the switch and so that a ratio of a radial distance from the switch to a point of user contact with the selectable button and a radial distance from the switch to a pivot point of the displacement control member is such that a user input force that is required to activate the switch is relatively uniform regardless of where the user contacts the selectable button.

In some embodiments, the displacement control member includes a plurality of arms that extend radially from a central hub. A radial length of at least two of the arms may be different. In some embodiments, the method may additionally include coupling the displacement control member with the housing so that a pivot surface of the displacement control member is radially offset from the central axis of the selectable button. The pivot surface may define the pivot point that effects pivoting of the selectable button and the displacement control member upon user selection of the selectable button.

BRIEF DESCRIPTION OF THE DRAWINGS

The present invention is described in conjunction with the appended figures:

FIGS. 2A-D illustrate various exploded perspective views of the hazard detector of FIGS. 1A and 1B.

FIGS. 2E and 2F illustrate an embodiment of components of a smart combined smoke detector and carbon monoxide device.

Figure 1A:
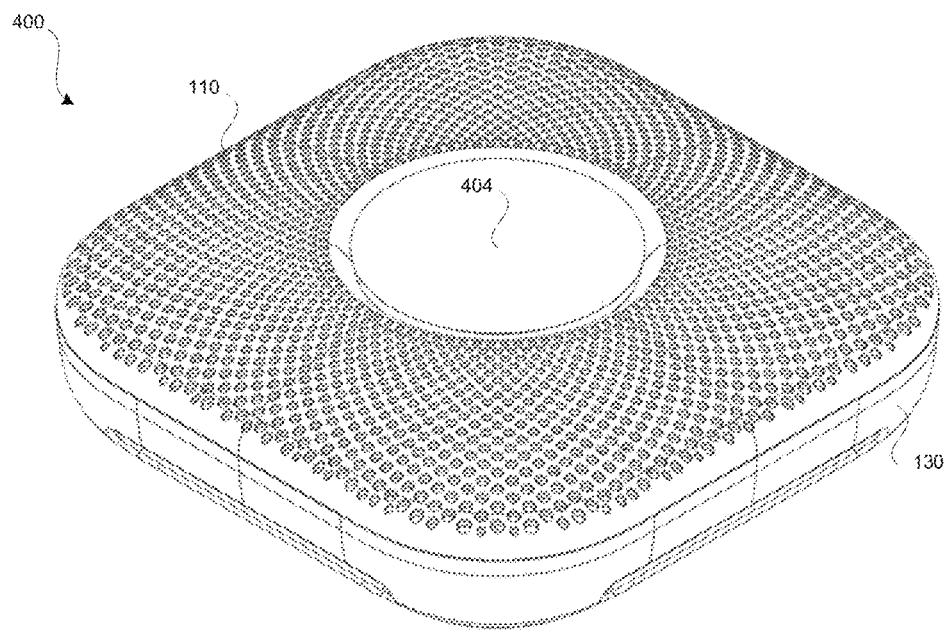
FIGS. 1A and 1B illustrate a front and rear perspective view of a hazard detector.

In the appended figures, similar components and/or features may have the same numerical reference label. Further, various components of the same type may be distinguished by following the reference label by a letter that distinguishes among the similar components and/or features. If only the first numerical reference label is used in the specification, the description is applicable to any one of the similar components and/or features having the same first numerical reference label irrespective of the letter suffix.

DETAILED DESCRIPTION OF THE INVENTION

The ensuing description provides exemplary embodiments only, and is not intended to limit the scope, applicability or configuration of the disclosure. Rather, the ensuing description of the exemplary embodiments will provide those skilled in the art with an enabling description for implementing one or more exemplary embodiments. It being understood that various changes may be made in the function and arrangement of elements without departing from the spirit and scope of the invention as set forth in the appended claims.

According to one aspect, a displacement control member for controlling the displacement of a selectable button is described herein. The displacement control member may be especially useful for selectable buttons of hazard detectors, although the displacement control member may find usefulness in various other applications. The displacement control member is useful for equalizing an input force that is required to activate a switch that is positioned behind the selectable button. In some embodiments, the switch may be positioned off-axis or off-center from a central axis or position of the selectable button. The off-axis switch affects the input force that is required to activate the switch by varying a distance from the input force to the switch and from the switch to a pivot point. Stated differently, due to the off-axis or off-center positioning of the switch in comparison with the button's central axis or position, the pivot point distance and the input force distance as measured from the switch is dependent on the portion or area of the button that is selected. Because the pivot point and input force varies, the required input force to activate the button typically also varies. The term "equalizing the input force" as used herein means that the input force is more uniform despite the off-axis positioning of the switch. The term encompasses some variation from uniform such as, for example, up to a 40% deviation, although a deviation of less than 30% or 25% is more common, and a deviation of less than 20% is preferred.

In the hazard detectors described herein, the switch is typically positioned off-axis or off-center from the central axis or position of the selectable button in order to accommodate a PIR sensor that is also positioned axially behind the selectable button. In the embodiments described herein, the selectable button also functions as a Fresnel lens for the PIR sensor. Concentrically aligning the PIR sensor and selectable button allows the Fresnel lens pattern that is formed on the selectable button to be symmetric and/or also allows the PIR sensor to have a wider field of view within a room. This enable the hazard device to have greater occupancy detection coverage. Because the PIR sensor is concentrically aligned with the selectable button, this space cannot be occupied by the switch. As such, the switch is positioned off-axis or off-center from the selectable buttons central axis.

The displacement control member compensates for the off-axis or off-center positioning of the switch, which results in a more normalized or equalized input force that is required to activate the switch. In some embodiments, the displacement control member is operationally coupled with the selectable button so that axial depression of the selectable button effects pivoting of the selectable button and pivoting of the displacement control member into contact with the switch. The displacement control member equalizes the user input force that is required to activate the switch by ensuring that a ratio of a radial distance from the switch to the user input force and a radial distance from the switch to a pivot point of the displacement control member is substantially the same regardless of where the user selects the selectable button. To achieve this substantially constant ratio, the displacement control member includes a pivot surface that defines the fulcrum point and that effects pivoting of the selectable button and the displacement control member upon user selection of the selectable button. In some embodiments, the pivot surface may include a radially flange that extends around a majority of an outer perimeter of the displacement control member. In other embodiments, the displacement control member includes a plurality of arms that extend radially from a central hub, such as five arms that extend radially from the central hub. In such embodiments, a radial length of at least two of the arms may be different. In some embodiments, the arms may be mirrored about a plane that orthogonally intersects the displacement control member. In such embodiment, each arm on one side of the plane may have a different radial length from the central hub. In any of the embodiments, the pivot surface may be radially offset from the central axis of the selectable button.

The ratio of the radial distance from the switch to the user input force and from the switch to the fulcrum point may be between about 3:1 and 1:3, and more commonly between about 3:2 and 2:3. The use of the displacement control member greatly reduces the deviation of the input force that is required to activate the switch regardless of where the user contacts and presses on the control button. Stated differently, the use of the displacement control member ensures that the required input force is relatively constant regardless of where the user contacts and presses on the control button. As a further explanation, since the switch is off-axis or off-center relative to the control button (or simply button), without the displacement control member, selecting one end of the button will more easily activate the switch in comparison with the other end of the button. In some embodiments, the variation or deviation of the input force may be greater than 75%. This non-uniform or uneven force input requirement may provide a bad user experience with the control button. The use of the displacement control member renders that input force that is required to activate the switch substantially more uniform. The displacement control member may render the input force variation or deviation to less than 40% and more commonly less than 30% or 25%. In a specific embodiment, the input force variation or deviation is less than 20%.

In a specific embodiment, the displacement control member may be utilized in a hazard detector that detects the presence of a hazard in a building or structure. The hazard detector may include a housing having an interior region within which components of the hazard detector are contained. The housing may have a plurality of openings through which air flows so as to be accessible to a hazard sensor positioned within the interior region of the housing. The hazard detector may also include a selectable button that is positioned on a front portion of the hazard detector so as to face and be selectable by a user when the hazard detector is mounted on a wall or ceiling of the building or structure. A switch may be disposed within the housing and axially under the selectable button. The switch may be positioned radially offset, or off-axis, from a central axis of the selectable button and may be activatable upon user selection of the selectable button. The displacement control member may be disposed within the housing between the selectable button and the switch. The displacement control member may be operationally coupled with the selectable button so that axial depression of the selectable button effects pivoting of the selectable button and pivoting of the displacement control member into contact with the switch. As described herein, the displacement control member may be configured to equalize a user input force that is required to activate the switch by being coupled with the housing and selectable button so that a ratio of a radial distance from the switch to the user input force and a radial distance from the switch to a pivot point of the displacement control member is substantially the same regardless of where the user selects the selectable button. The displacement control member may include one or more spring components that are coupled with the housing and configured to bias the selectable button toward an unselected or non-pressed position. In some embodiments the displacement control member includes a centrally located aperture that is positioned so as to not impede a proximity sensor that is disposed axially behind the displacement control member from sensing user occupancy within the building or structure. Having described several embodiments of the hazard detector generally, additional aspects will be realized with reference to the description of the various figures provided below. In some embodiments, the hazard detector may be a smoke detector that detects the presence of smoke within a home, building, or other structure.

Having described several aspects of the hazard detector generally, additional details will be recognized with respect to the description below of the various figures. FIG. 1A illustrates a top projection view of a hazard detector 400. Hazard detector 400 may generally be square or rectangular and have rounded corners. Visible in the top projection view are various components of the hazard detector 400, including: cover grille 110, lens/button 404, and enclosure of housing 130. Cover grille 110 may serve to allow air to enter the hazard detector 400 through many holes while providing a pleasing aesthetic appearance. Cover grille 110 may further serve to reflect light into the external environment of hazard detector 400 from internal light sources (e.g., LEDs). Light may be routed internally to cover grille 110 by a light pipe, noted in relation to FIGS. 2A and 2C. It should be understood that the arrangement of holes and shape of cover grille 110 may be varied by embodiment. Lens/button 404 may serve multiple purposes. First, lens/button 404 may function as a lens, such as a Fresnel lens, for use by a sensor, such as an infrared (IR) sensor, located within the hazard detector 400 and behind lens/button 404 for viewing the external environment. Additionally, lens/button 404 may be actuated by a user by pushing lens/button 404. Such actuation may serve as user input to the hazard detector 400. Housing 130 may serve as a housing for at least some of the components of the hazard detector 400.

Figure 1B:
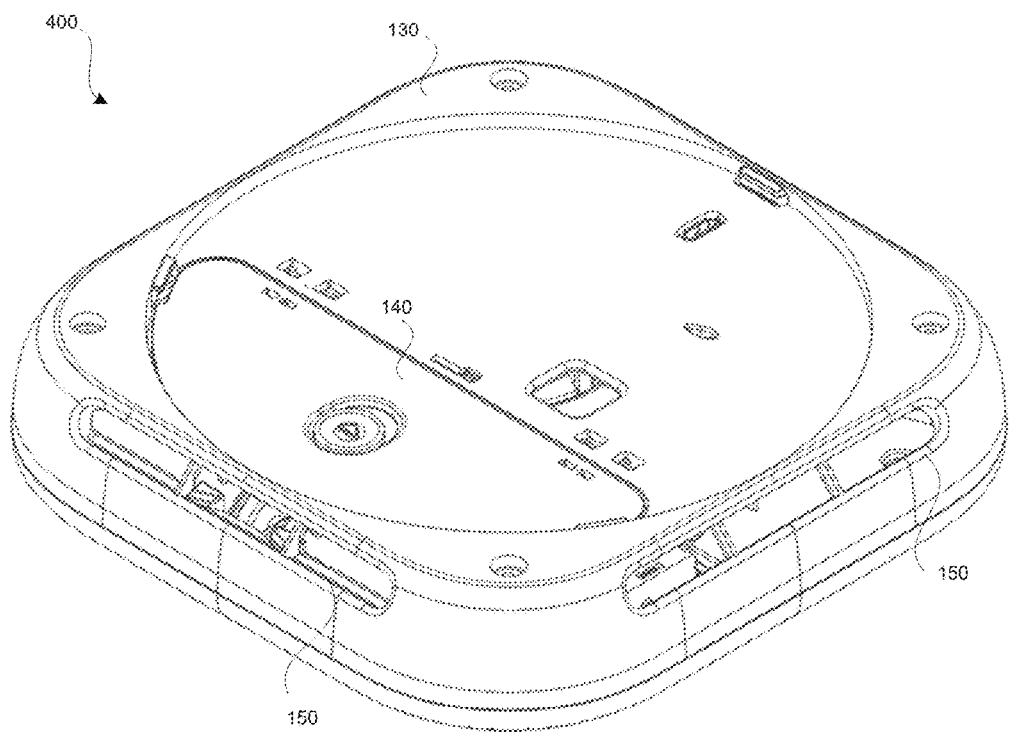

FIG. 1B illustrates an bottom projection view of the hazard detector 400. Visible from this view is a portion of the housing 130. On housing 130, battery compartment door 140 is present through which a battery compartment is accessible. Also visible are airflow vents 150, which allow air to pass through housing 130 and enter the smoke chamber of the hazard detector 400.

Figure 2A:
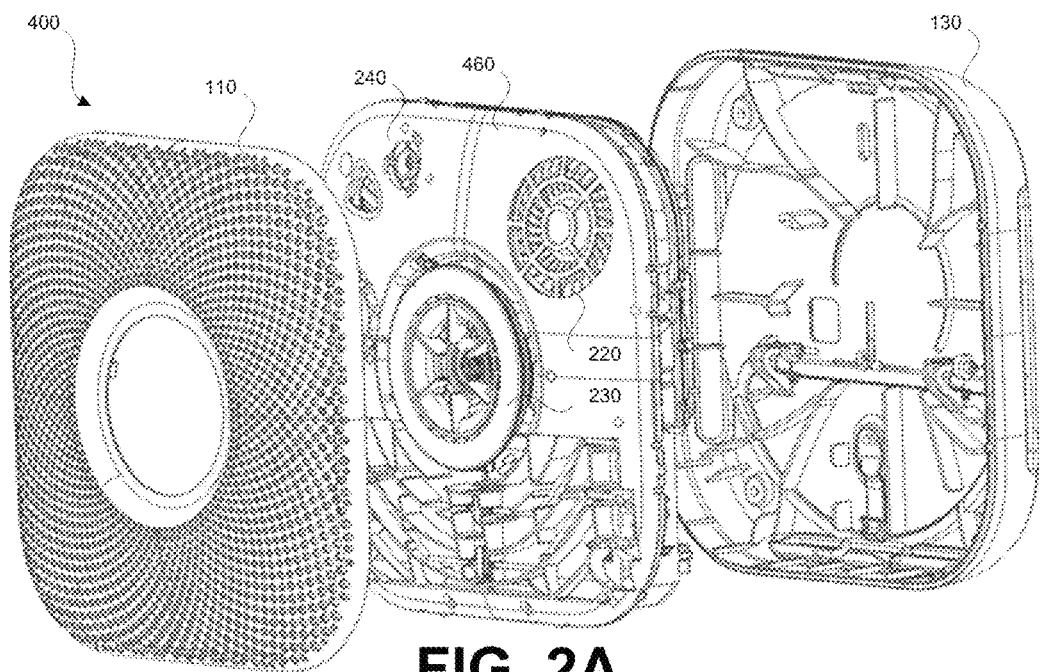
Figure 2B:
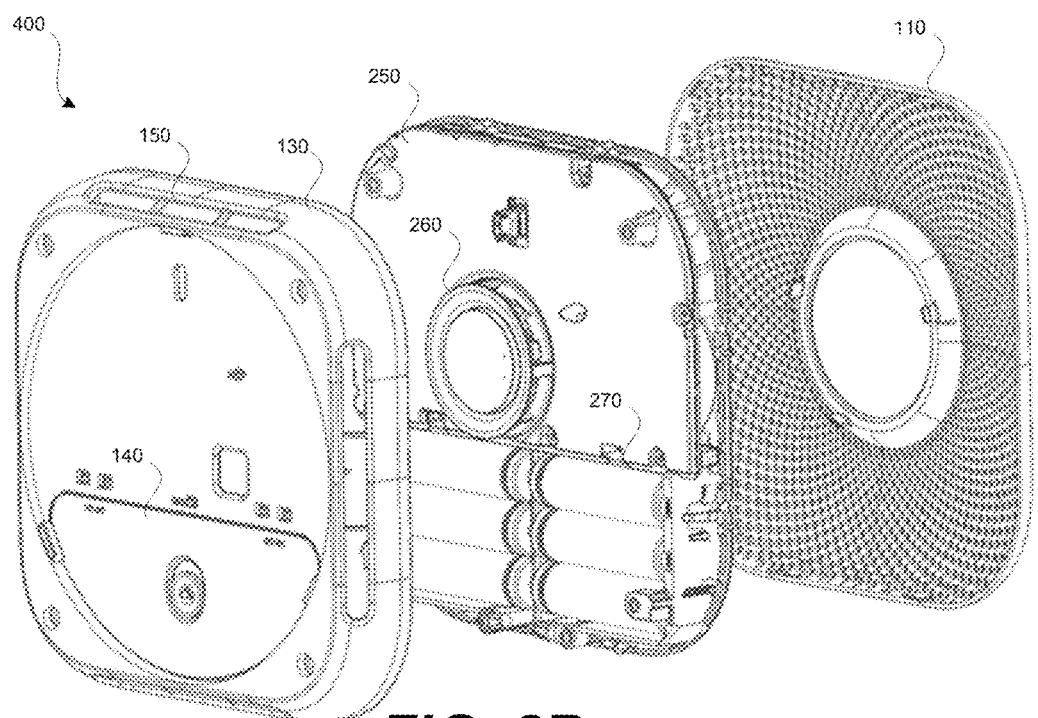

FIGS. 2A-D illustrate an embodiment of an exploded hazard detector. The devices of FIGS. 2A-D can be understood as representing various views of the hazard detector 400 of FIGS. 1A and 1B. In FIG. 2A, hazard detector 400 is shown having cover grille 110 and enclosure/housing 130, which together house main chassis 460. Chassis 460 may house various components that can be present in various embodiments of hazard detector 400, including speaker 220, light pipe 230, and microphone 240. FIG. 2B illustrates the hazard detector 400 from a different viewpoint. In FIG. 2B, cover grille 110, enclosure/housing 130, airflow vent 150, and battery compartment door 140 are visible. A gap may be present between enclosure/housing 130 and main circuit board 288 to allow airflow through airflow vents 150 to have a relatively unobstructed path to enter and exit smoke chamber 260. The main circuit board 288 may also have one or more laminar flow covers over some or all components to help with even, laminar airflow within the device and to prevent a user from accidentally touching an ESD sensitive component. Also present in FIG. 2B are multiple batteries, which are installed within battery compartment 270 of hazard detector 400 and which are accessible via battery compartment door 140.

Figure 2C:
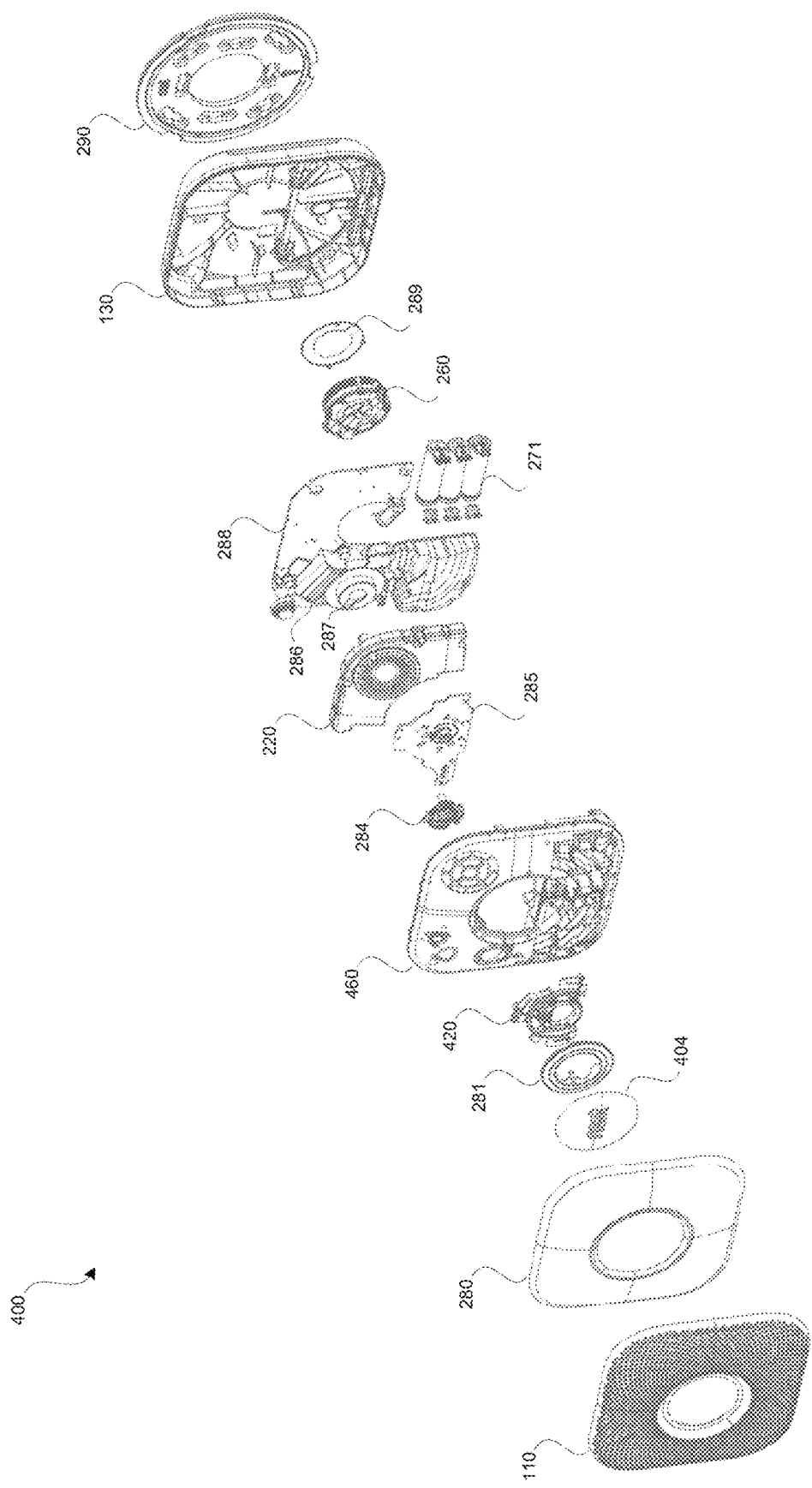

FIG. 2C represents a more comprehensive exploded view of the hazard detector 400.

Hazard detector 400 includes: cover grille 110, mesh 280, lens/button 404, light pipe 281, displacement control member 420, chassis 460, diaphragm 284, passive infrared (PIR) and light emitting diode (LED) daughterboard 285, speaker 220, batteries 271, carbon monoxide (CO) sensor 286, buzzer 287, main circuit board 288, smoke chamber 260, chamber shield 289, enclosure/housing 130, and surface mount plate 290. The cover grille 110 and/or mesh 280 may help admit CO to the interior of the device where the carbon monoxide (CO) sensor 286 is located. It should be understood that alternate embodiments of hazard detector 400 may include a greater number of components or fewer components than presented in FIG. 2C.

A brief description of the above noted components that have yet to be described follows: Mesh 280 sits behind cover grille 110 to obscure external visibility of the underlying components of hazard detector 400 while allowing for airflow through mesh 280. Light pipe 281 serves to direct light generated by lights (e.g., LEDs such as the LEDs present on daughterboard 285) to the external environment of hazard detector 400 by reflecting off of a portion of cover grille 110. As described in greater detail herein, displacement control member 420 serves to allow a near-constant pressure to be placed by a user on various locations on lens/button 404 to cause actuation. Displacement control member 420 may cause an actuation sensor located off-center from lens/button 404 to actuate in response to user-induced pressure on lens/button 404. Diaphragm 284 may help isolate the PIR sensor on daughterboard 285 from dust, bugs, and other matter that may affect performance. Daughterboard 285 may have multiple lights (e.g., LEDS) and a PIR (or other form of sensor). Daughterboard 285 may be in communication with components located on main circuit board 288. The PIR sensor or other form of sensor on daughterboard 285 may sense the external environment of hazard detector 400 through lens/button 404.

Buzzer 287, which may be activated to make noise in case of an emergency (and when testing emergency functionality), and carbon monoxide sensor 286 may be located on main circuit board 288. Main circuit board 288 may interface with one or more batteries 271, which serve as either the primary source of power for the device or as a backup source of power if another source, such as power received via a wire from the grid, is unavailable. Protruding through main circuit board may be smoke chamber 260, such that air (including smoke if present in the external environment) passing into enclosure/housing 130 is likely to enter smoke chamber 260. Smoke chamber 260 may be capped by chamber shield 289, which may be conductive (e.g., metallic). Smoke chamber 260 may be encircled by a conductive (e.g., metallic) mesh (not pictured). Enclosure/housing 130 may be attached and detached from surface mount plate 290. Surface mount plate 290 may be configured to be attached via one or more attachment mechanism (e.g., screws or nails) to a surface, such as a wall or ceiling, to remain in a fixed position. Enclosure/housing 130 may be attached to surface mount plate 290 and rotated to a desired orientation (e.g., for aesthetic reasons). For instance, enclosure/housing 130 may be rotated such that a side of enclosure/housing 130 is parallel to an edge of where a wall meets the ceiling in the room in which hazard detector 400 is installed.

Figure 4A:
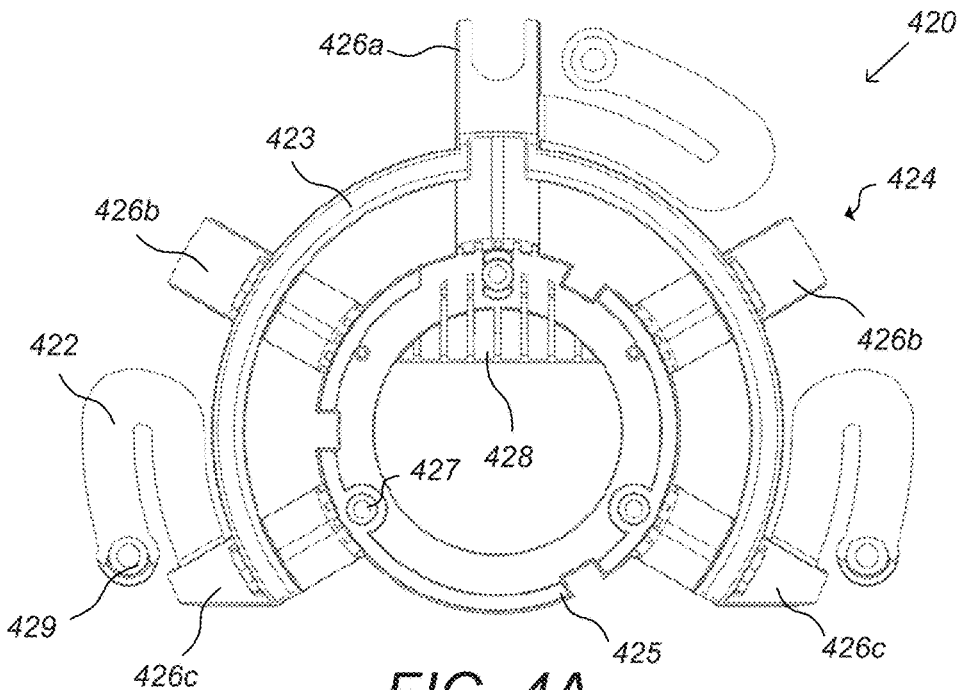
FIGS. 4A and 4B illustrate a displacement control member that is operationally coupled with the hazard detector's selectable button to effect pivoting of the selectable button and the displacement control member.

FIG. 2D represents the comprehensive exploded view of the hazard detector 400 of FIG. 4A viewed from a reverse angle as presented in FIG. 2C. Hazard detector 400 includes: cover grille 110, mesh 280, lens/button 404, light pipe 281, displacement control member 420, chassis 460, diaphragm 284, passive infrared (PIR) and light emitting diode (LED) daughterboard 285, batteries 271, speaker 220, carbon monoxide (CO) sensor 286 (not visible), buzzer 287 (not visible), main circuit board 288, smoke chamber 260, chamber shield 289, enclosure/housing 130, and surface mount plate 290. It should be understood that alternate embodiments of hazard detector 400 may include a greater number of components or fewer components than presented in FIG. 2D.

FIG. 2E shows a top view of an embodiment of some components of a smart combined smoke detector and carbon monoxide device, and FIG. 2F is a cross-sectional view of those components taken along cutting-plane line C-C of FIG. 2E. One of the illustrated components is gasket 284. In some embodiments, gasket 284 physically and thermally isolates PIR sensor 291 by providing thermal-resistant barrier around heat-sensitive PIR sensor 291, thereby limiting heat transfer from LEDs via radiation and/or convection. In some embodiments, gasket 284 is disposed between support lens/button 404 and PCB 285, and at least partially encloses PIR sensor 291. In some embodiments, gasket 284 includes sleeve 293 and flange 295. Sleeve 293 slides tightly over and surrounds at least a portion of outer periphery of a body portion of PIR sensor 291, thereby providing a thermal-isolation barrier at least partially around PIR sensor 291. In some embodiments, 295 flange is a flexible diaphragm that flexes and deforms to allow actuation of button/lens 404, while enabling sleeve 293 to maintain a seal around PIR sensor 291. In some embodiments, gasket 284 is made of a silicone rubber sleeve.

Figure 3A:
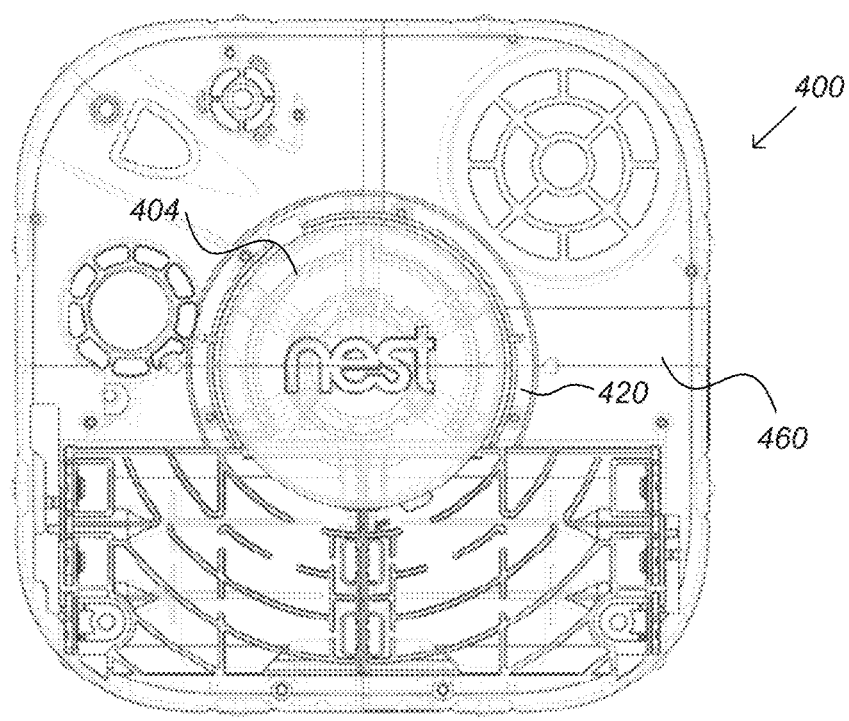
FIGS. 3A-C illustrate top views of the hazard detector and selectable button of FIGS. 1A and 1B.
Figure 3B:
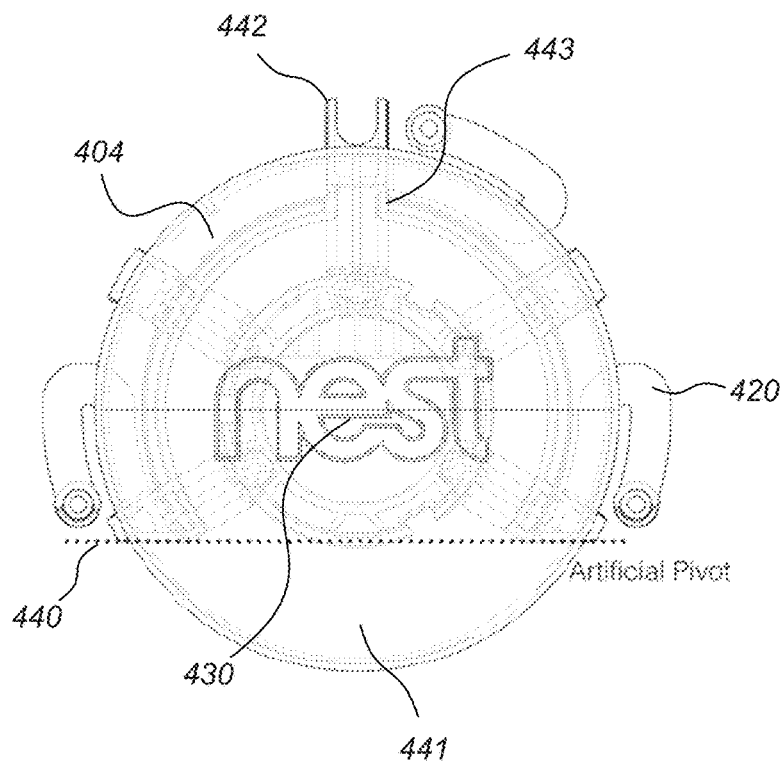

Referring now to FIGS. 3A and 3B, illustrated is an embodiment of a hazard or smoke detector 400 (hereinafter smoke detector 400). As illustrated in the previous figures, the smoke detector 400 includes a cover grille 110 that provides an aesthetic look or appeal to the smoke detector 400. The cover grille 110 is removed from the smoke detector 400 illustrated in FIG. 3A in order to illustrate a chassis 460 that is positioned behind the cover grille 110. The chassis 460 covers and conceals various components that are positioned within the interior of the smoke detector 400, such as a smoke chamber (not shown), alarm device (not shown), carbon monoxide detector (not shown), circuit board (not shown), and the like. The chassis 460 and cover grille 110 are typically coupled with a housing 401 component. The various components of the smoke detector 400 are housed or disposed within an interior region of the housing 401 typically between the housing 401 and chassis 460. The housing 401 includes a plurality of openings through which air flows so as to be accessible to a hazard sensor (e.g., smoke chamber, carbon monoxide detector, and the like) positioned within the interior region of the housing 401.

The chassis 460 of FIG. 3A is illustrated as being transparent so that some of the interior components are visible, although the chassis 460 is normally made of an opaque material. The transparent chassis 460 allows the displacement control member 420 to be visible. The displacement control member 420 is disposed axially under the selectable button member 404 and commonly also axially under the chassis 460. The selectable button 404 is positioned on a front portion of the smoke detector's chassis 460 and through an aperture of the cover grille 110 so as to face a user when the smoke detector 400 is mounted on a wall or ceiling of a building, home, or other structure. Because the selectable button 404 faces the user, the selectable button 404 is easily accessible to and selectable by the user. The displacement control member 420 is disposed axially above a switch (not shown in FIGS. 3A and 3B) that is disposed within the housing and axially under the selectable button 404 and chassis 460. As described in greater detail herein, the switch is positioned radially offset, or off-axis, from a central axis of the selectable button 404. The switch is activatable upon user selection of the selectable button 404.

The displacement control member 420 is operationally coupled with the selectable button 404 so that axial depression of the selectable button 404 effects pivoting of the selectable button 404 and pivoting of the displacement control member 420 into contact with the switch. The displacement control member 420 is configured to equalize a user input force that is required to activate the switch. This is achieved by positioning and/or coupling the displacement control member 420 with the smoke detector 400 and selectable button 404 so that a ratio of a radial distance from the switch to the user input force and a radial distance from the switch to a pivot point of the displacement control member 420 is substantially the same regardless of where the user selects the selectable button 404. Specifically, the displacement control member 420 is positioned and/or coupled with the smoke detector 400 so that a pivot point of the displacement control member 420 about the chassis 460 is varied in accordance with and to accommodate a position where the user contacts and presses the selectable button 404. The pivot point may be varied in order to maintain a relatively constant ratio of the switch to input force distance and switch to pivot point distance. The constant ratio of ensures that the required input force is relatively the same regardless of where the user contacts and presses on the selectable button 404. This concept is described in greater detail below.

FIG. 3B also illustrates a sensor 430 that is disposed axially under the selectable button 404 and typically under the chassis 460. The selectable button 404 is illustrated as being transparent so that the sensor 430 is visible, although the selectable button 404 is normally made of an opaque material. In some embodiments, the sensor 430 may be the switch that is activatable upon depression of the selectable button 404, although the sensor 430 is normally a proximity sensor that is used to detect and/or determine an occupancy of the home, building, or structure. In one embodiment, the sensor 430 may be a passive infrared sensor. In such embodiments, the selectable button 404 may function as a Fresnel lens to aid in detection of a user's presence within the home, building, or structure. As illustrated, the displacement control member 420 includes a centrally located aperture that is positioned so as to not impede the sensor 430 from sensing user occupancy within the home, building, or structure.

Figure 4B:
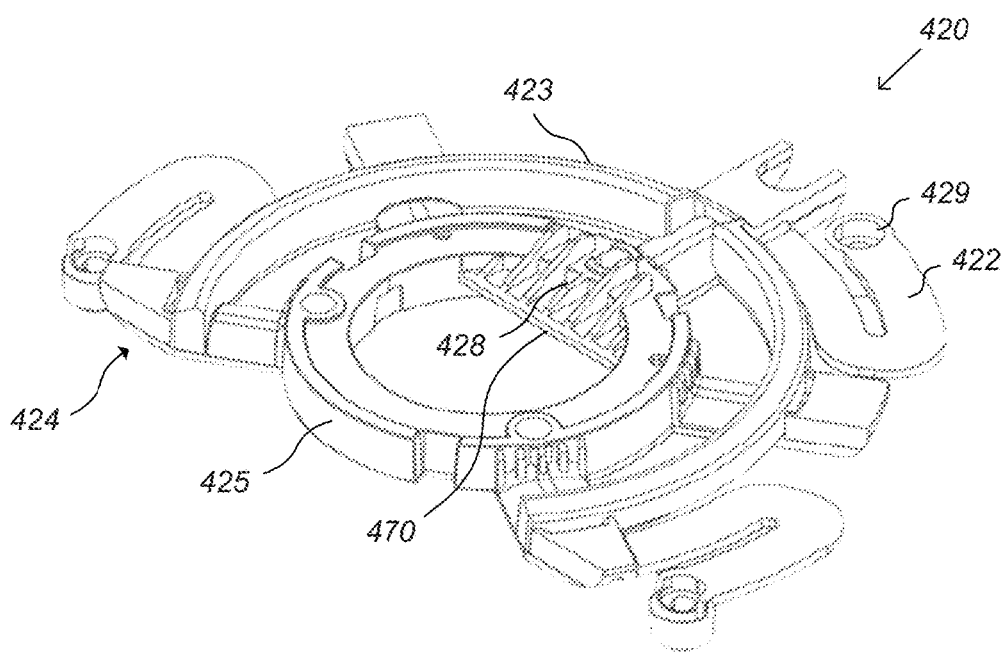

Referring now to FIGS. 4A and 4B, illustrated is the displacement control member 420 that is operationally coupled with the selectable button 404 to effect pivoting of the selectable button 404 and the displacement control member 420 into contact with a switch 470. The switch 470 is shown positioned under a switch member 428 that protrudes radially inward from a central hub 425 of the displacement control member 420. As described previously, pressing of the selectable button 404 causes the selectable button 404 and displacement control member 420 to pivot about the chassis 460, which causes the switch member 428 to contact and activate or trigger the switch 470.

Figure 4C:
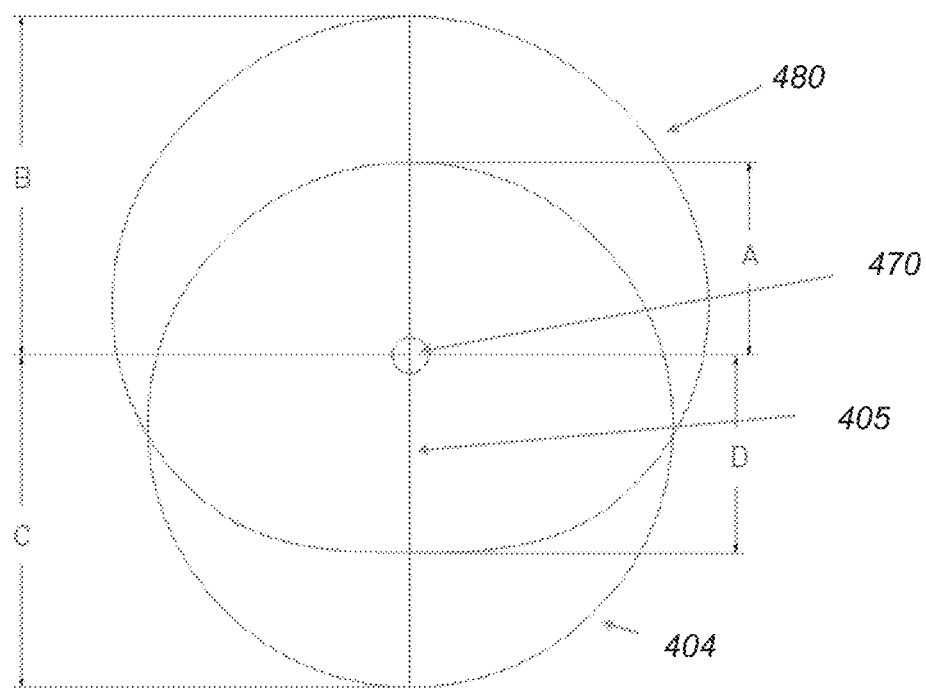
FIGS. 4C and 4D illustrate representations of radial flange and radial arm configurations that may be employed with the displacement control member.

The displacement control member 420 includes a pivot surface that defines one or more fulcrum points about which the displacement control member 420 and selectable button 404 pivot upon user selection of the selectable button 404. As shown in FIG. 4C, in some embodiments the pivot surface is defined by a radial flange 480 that extends radially outward from the central hub 425 (or outer hub 423) and around a majority of the outer perimeter of the displacement control member 420. FIG. 4C shows a representation of the radial flange 480 that would extend from the central hub 425. As illustrated in FIG. 4C, in some embodiments the radial flange 480 may extend entirely around the outer perimeter of the displacement control member 420, while in other embodiments radial flange 480 may extend only around a portion of the outer perimeter, such as equivalent to the perimeter of the outer hub 423. The radial flange 480 may be roughly oval or egg-shaped rather than circular. One advantage of the radial flange 480 is that the radial flange provides essentially an infinite number of fulcrum or pivot points for the displacement control member 420, which may result in a more constant pivot point to input force ratio as described herein. FIG. 4C also illustrates the switch 470 being positioned off-axis or off-center from the central axis 405 of the selectable button 404. FIG. 4C further illustrates an upper push or selection point A on the selectable button 404 and a corresponding lower pivot point D on the radial flange 480 about which the selectable button 404 and radial flange 480 pivot when a user pushes on the upper selection point A. Similarly, FIG. 4C illustrates a lower push or selection point C on the selectable button 404 and a corresponding upper pivot point B on the radial flange 480 about which the selectable button 404 and radial flange 480 pivot when a user pushes on the lower selection point C. A ratio of lengths A to D and lengths C to B is approximately the same.

As shown in FIGS. 4A and 4B, in other embodiments the pivot surface may be defined via a plurality of arms 424 that extend radially outward from the central hub 425. As described in greater detail below, the displacement control member 420 is coupled with the chassis 460 so that each of the arms 424 are biased axially upward and into contact with the inner surface of the chassis 460. Accordingly, the arms 424 function as a fulcrum or pivot points to effect pivoting of the displacement control member 420 and selectable button 404 when the user presses the selectable button 404.

Figure 3C:
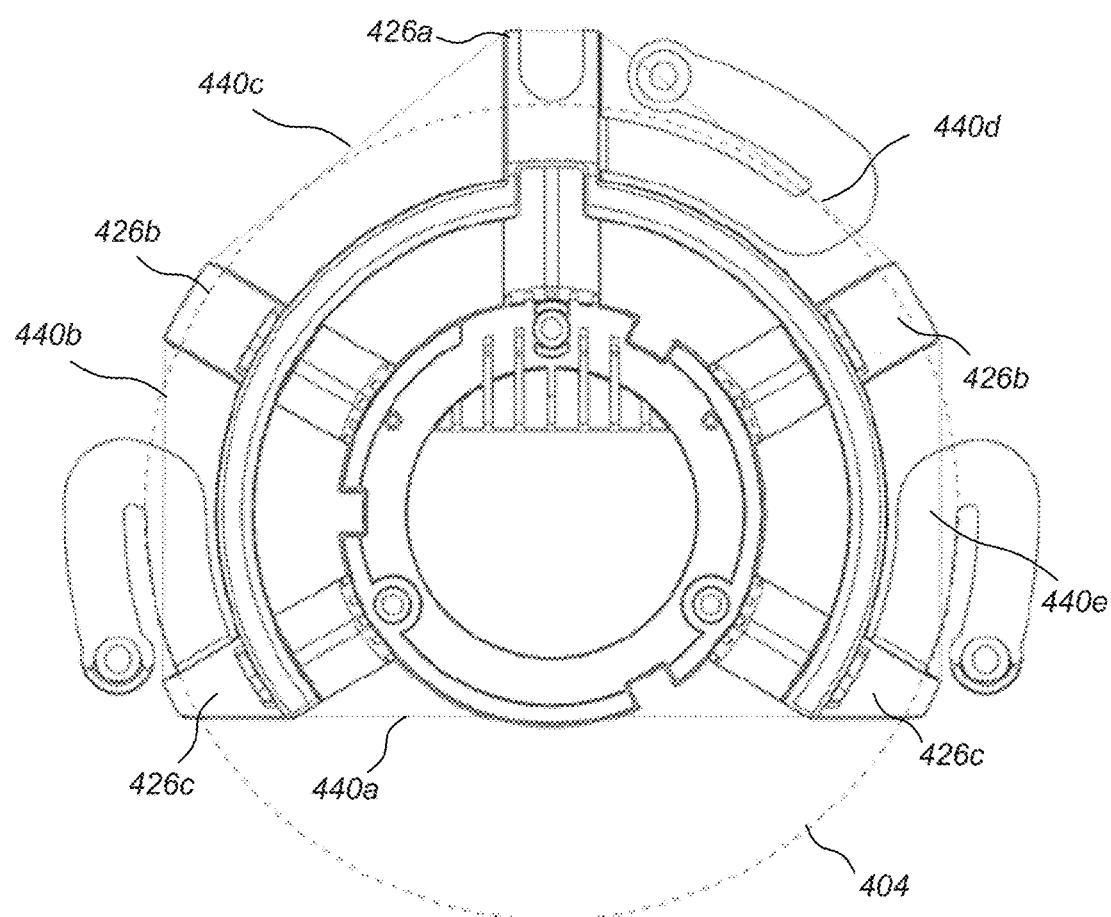

The arms may function individually to define the fulcrum or pivot point, or may function cooperatively to define the fulcrum or pivot point. For example, depending on where the user presses on the selectable button 404, the displacement control member 420 may pivot about a single one of the arms 424, or may pivot about two of the arms 424. If the user presses the selectable button 404 in a position that is roughly 180 degrees from one of the arms 424, the displacement control member 420 will pivot about that arm 424. If the user presses the selectable button 404 in a position that is equivalent to roughly between two of the arms 424, the displacement control member 420 will pivot about each of those two arms. This concept is illustrated in greater detail FIGS. 3B and 3C. For example, as illustrated in FIG. 3B, if the user presses the selectable button 404 at or near the position labeled 441, the displacement control member 420 and selectable button 404 will pivot about the upper-most arm only, which is labeled 442. In contrast, if the user presses the selectable button 404 at or near the position labeled 443, which is roughly between the two lower-most arms, the displacement control member 420 and selectable button 404 will pivot about an artificial pivot or fulcrum point 440 that is defined or created by the two lower-most arms. The artificial pivot or fulcrum point 440 is defined or created by the two lower-most arms as both of these arms contact the inner surface of the chassis 460 when the user presses on the selectable button 404 at or near the position 443. As illustrated in FIG. 3C, each of the arms may function individually to create or define a fulcrum or pivot point, or may function with an adjacent arm to cooperatively create or define a fulcrum or pivot point. Specifically, FIG. 3C illustrates five artificial pivot or fulcrum point (i.e., 440a, 440b, 440c, 440d, and 440e) that extend between and are each defined by the adjacent arms (i.e., arms 426a, 426b, and 426c). The displacement control member 420 defines a pentagram of artificial pivot or fulcrum points. FIG. 3C further illustrates the displacement control member 420 and pivot points in relation to the selectable button 404.

In some embodiments, a radial length of at least two of the arms 424 may be different. For example, the upper-most arm labeled 426a in FIG. 4A may have a radial length that is longer than both arms 426b and 426c. In most embodiments, the upper-most arm 426a has the lonest radial length due to the switch 470 being positioned closest to this arm. In some embodiments, the arms 426b and 426c may also have different radial lengths, typically with arm 426c being slightly shorter than arm 426b. In other embodiments, the arms 426b and 426c may have equivalent radial lengths.

The different or varying radial lengths of the arms 424 is due to the switch 470 being positioned radially offset or off-axis from the central axis or position of the selectable button 404. The different radial lengths of the arms 424 compensate for the varying distances from the switch 470 to the location of the user input force. This compensation is achieved by varying the fulcrum or pivot point of the displacement control member 420 as described below.

In some embodiments, the arms 424 are mirrored about a plane (not shown) that intersects the displacement control member 420 in a direction that is orthogonal to the page and parallel to the arm 426a. In such an embodiment, the arms 426b and 426c are mirrored about this plane. The arms 426b and 426c that are mirrored about this plane typically have the same radial length as the corresponding arm on the opposite side of the plane—i.e., arms 426b and 426c on the opposite side of the plane. In one embodiment, each of the arms 426a, 426b, and 426c that are positioned on one side of the plane may have different radial lengths while the corresponding arms 426b and 426c that are positioned on the opposite side of the plane have the same radial length.

As illustrated, the displacement control member 420 also includes an outer hub 423 that is positioned coaxially with the central hub 425. The outer hub 423 is a wall that circumferentially surrounds a majority of the central hub 425. In some embodiments, the outer hub 423 may entirely surround the central hub 425. The outer hub 423 reinforces the arms 424 that extend radially outward from the central hub 425, which allows the thickness of the arms 424 that extend between the central hub 425 and outer hub 423 to be reduced. The portion of the arms 424 that extends radially outward from the outer hub 423 contact the inner surface of the chassis 460 and function as the fulcrum or pivot point.

The displacement control member 420 further includes one or more spring member 422 that extend in a u-shaped configuration from an arm 424. FIGS. 4A and 4B illustrate the displacement control member 420 including three spring members 422 that extend from the upper-most arm 426a and from each of the lower-most arms 426c. A distal end of the spring member 422 includes an aperture 429 or other coupling feature that allows the spring members 422 to be coupled or attached to the inner surface of the chassis 460, such as by inserting a screw or pin through the aperture 429. As described in greater detail below, the spring members 422 are configured so that attaching the spring members 422 with the chassis 460 causes the displacement control member 420 to be biased axially upward and against the inner surface of the chassis 460.

The displacement control member 420 further includes additional apertures 427 or coupling features that allow the displacement control member 420 to be coupled with the selectable button 404. For example, an inner surface of the selectable button 404 may include pins (not shown) that are insertable within the apertures 427 of the central hub 425 to couple or attach the selectable button 404 to the displacement control member 420.

Figure 5:
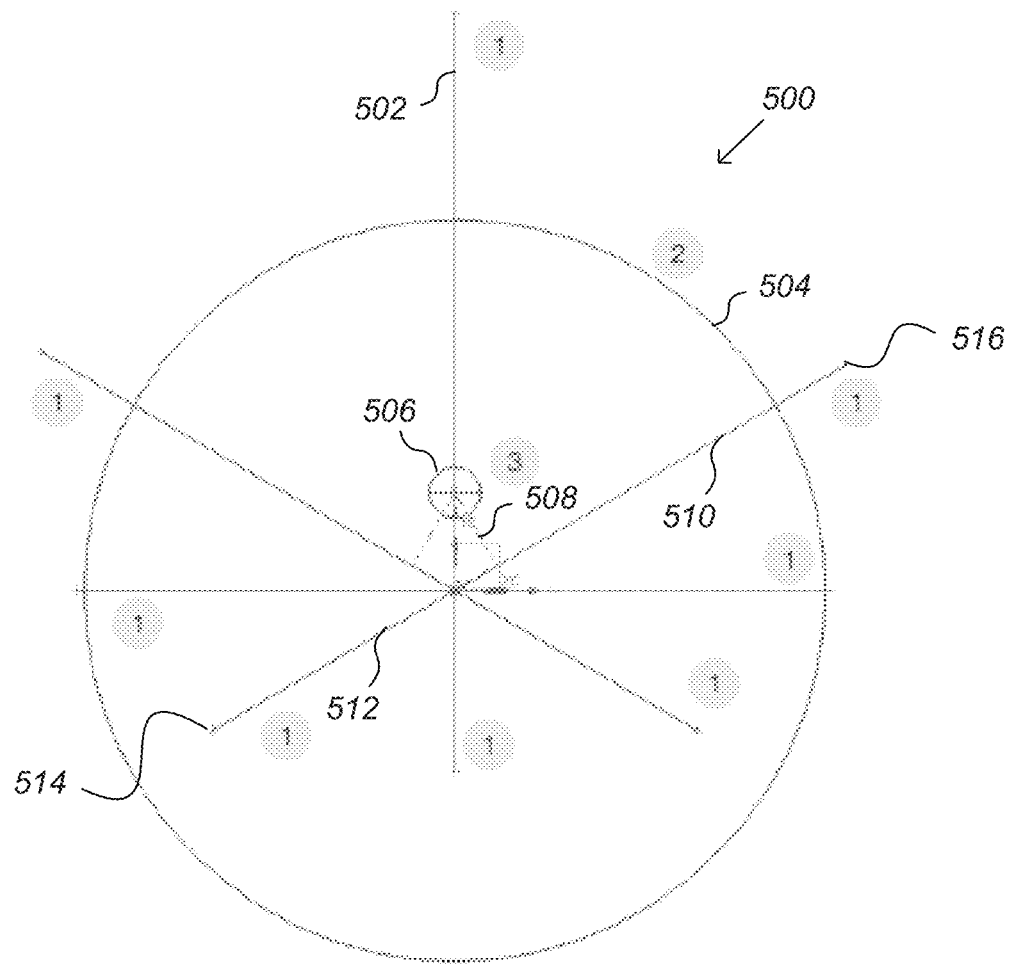
FIG. 5 illustrates a representation of pivot points that are created or defined by the displacement control member.

FIG. 5 illustrates a simple representation of the pivot points that are created by a displacement control member. The figure illustrates the pivot points in relation to a diameter of the selectable button 504. The figure also illustrates the off-center or off-axis switch 506. FIG. 5 illustrates the displacement control member including a plurality of arms 502 (also labeled 1) that create or define pivot or fulcrum points as described previously. The ends of the arms 502 illustrate where the displacement control member would pivot when the selectable button 504 is pressed on an opposite side. As illustrated, due to the off-center or off-axis positioning of the switch 506, the arms on the lower or bottom portion of the displacement control member are positioned within the diameter of the selectable button 504 while the arms on the upper or top portion are positioned outside the diameter of the selectable button 504. This configuration equalizes a ratio of the switch 506 to pivot point distance and switch 506 to input force distance to a greater degree than would be provided by a more or entirely symmetrical component. The ratio is substantially equalized regardless of where the user contacts and presses on the selectable button's outer surface.

For example if the user contacts and presses on the lower portion of the selectable button 504 approximately 180 degree from a top end of the vertically aligned arm 502, the displacement control member and selectable button 504 will pivot about the point or fulcrum that is well outside the diameter of the selectable button 504. In contrast, if the user contacts and presses on the upper portion of the selectable button 504 approximately 180 degree from a bottom end of the vertically aligned arm 502, the displacement control member and selectable button 504 will pivot about the point or fulcrum that is well inside the diameter of the selectable button 504. The different pivot points help ensure that the ratio of switch 506—pivot point distance and switch 506—input force distance is relatively equal, which results in a relatively equal input force being required to activate or trigger the switch 506. This relatively equal input force requirement results in a more pleasant user feel and experience in activating the switch 506.

FIG. 5 also illustrates that the switch 506 to the pivot point and/or user input force distance that is used in determining the above ratio is the adjacent line or leg of a right triangle formed between the switch 506 and the pivot point or user input force. For example, if the user contacts the selectable button 504 at a point 514, the hypotenuse of a right triangle is defined by the radial distance from the switch 506 to the point 514. The adjacent leg 512 of the right triangle is defined by a line that extends from the point 514 and intersect the opposite leg 508 at a right angle. Similarly, a right triangle is defined by the switch 506 and the pivot point 516 with the hypotenuse being defined by the radial distance from the switch 506 to the pivot point 516 and the adjacent leg 510 being defined by a line that extends from the pivot point 516 to an intersection with the opposite leg 508 at a right angle. In this example, the switch 506 to pivot point 516 distance is equivalent to line 510 and the switch 506 to user input force 514 distance is equivalent to line 512. Thus, the distance ratio of switch 506 to pivot point 516 and switch 506 to user input force 514 is approximately 510/512.

Figure 6A:
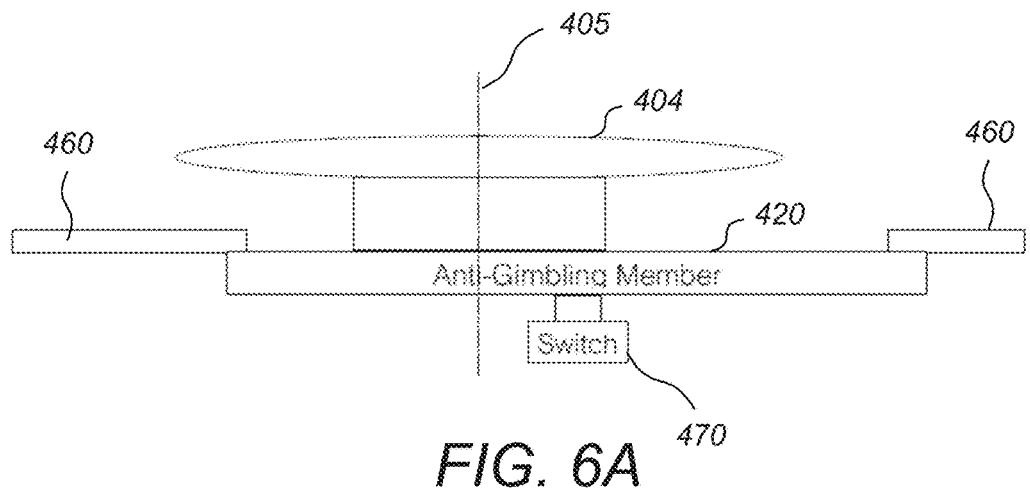
FIGS. 6A-E illustrate how the displacement control member helps ensure that a distance ratio is relatively constant or substantially similar regardless of where a user contacts the hazard detector's selectable button.

FIGS. 6A-E provide an illustration how the displacement control member helps ensure that the distance ratio of switch to input force and pivot point is relatively constant or substantially the same. FIG. 6A illustrates the displacement control member 420 coupled with the selectable button 404 and positioned so that the pivot surface or arms (e.g., 424) press upward and into contact with an inner surface of the chassis 460. FIG. 6A further illustrates that one end of the pivot surface or arm is positioned within a diameter of the selectable button 404 while the opposite end of the pivot surface or arm is positioned outside of the selectable button's diameter. FIG. 6A additionally illustrates that the switch 470 is positioned off-center or off-axis from a central axis 405 of the selectable button 404 by being positioned a radial distance from the central axis 405.

Figure 6B:
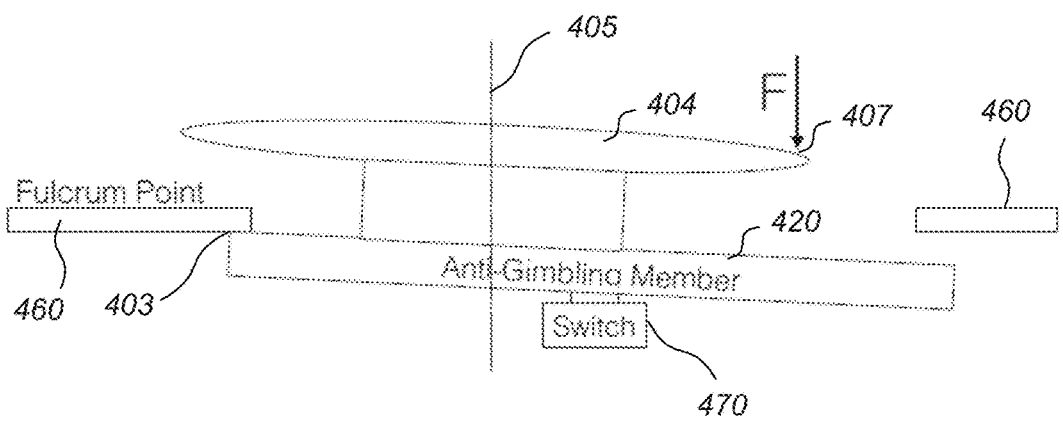

FIG. 6B illustrates the selectable button 404 being pressed on a right side or surface. Specifically, an input force F is exerted on the right side or surface 407 of the selectable button 404, which creates or defines a pivot or fulcrum point 403 via contact between the left arm of the displacement control member and the inner surface of the chassis 460. In response to the input force F, the right side of the selectable button 404 and the displacement control member pivot downward and activate or trigger the switch 470. The pivot or fulcrum point 403 is disposed within the diameter of the selectable button 404.

Figure 6C:
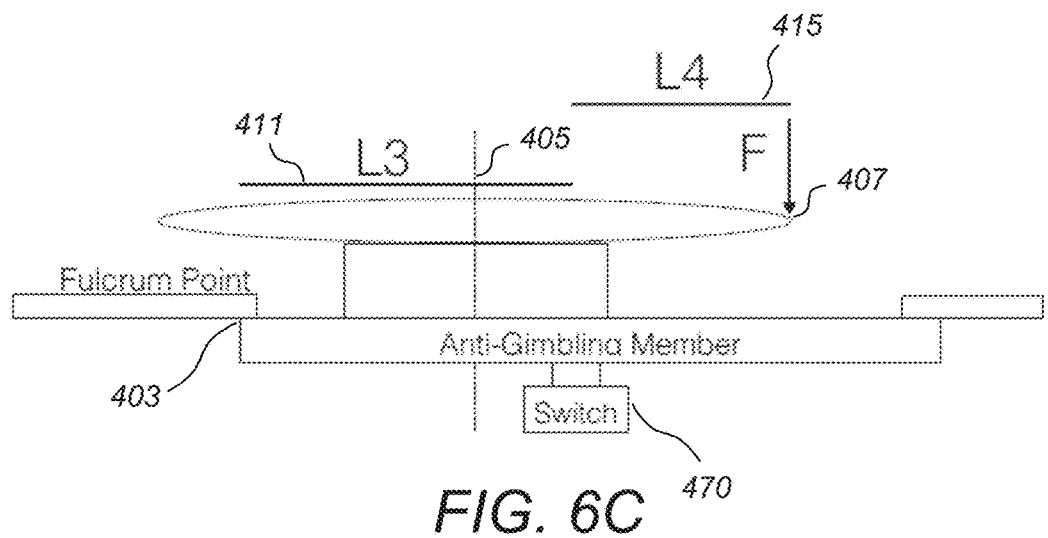

FIG. 6C illustrates that a distance 415 from the switch 470 to the point 407 where the input force F is exerted is approximately L4. Similarly, a distance 411 from the switch 470 to the pivot or fulcrum point 403 is approximately L3. A ratio of these distances is L4/L3.

Figure 6D:
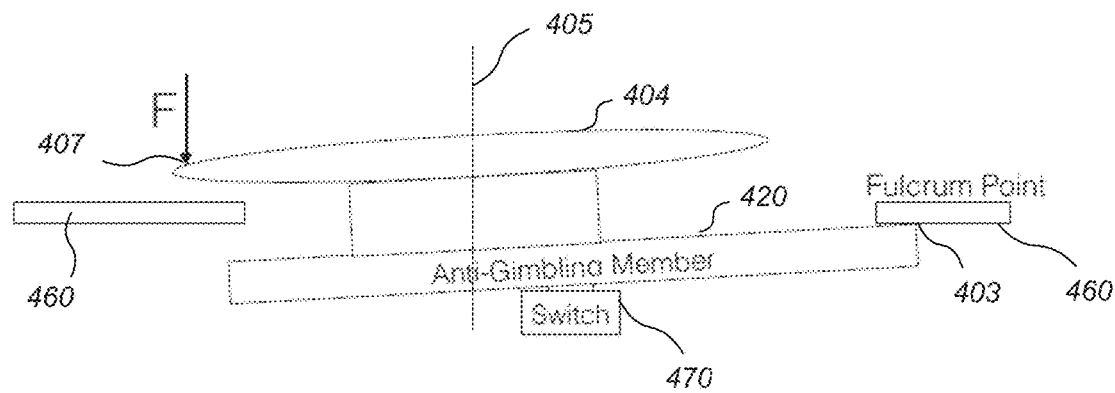

FIG. 6D illustrates the selectable button 404 being pressed on a left side or surface. Specifically, an input force F is exerted on the left side or surface 407 of the selectable button 404, which creates or defines a pivot or fulcrum point 403 via contact between the right arm of the displacement control member and the inner surface of the chassis 460. In response to the input force F, the left side of the selectable button 404 and the displacement control member pivot downward and activate or trigger the switch 470. In contrast to the illustration of FIG. 6B, the pivot or fulcrum point 403 is disposed outside of the diameter of the selectable button 404.

Figure 6E:
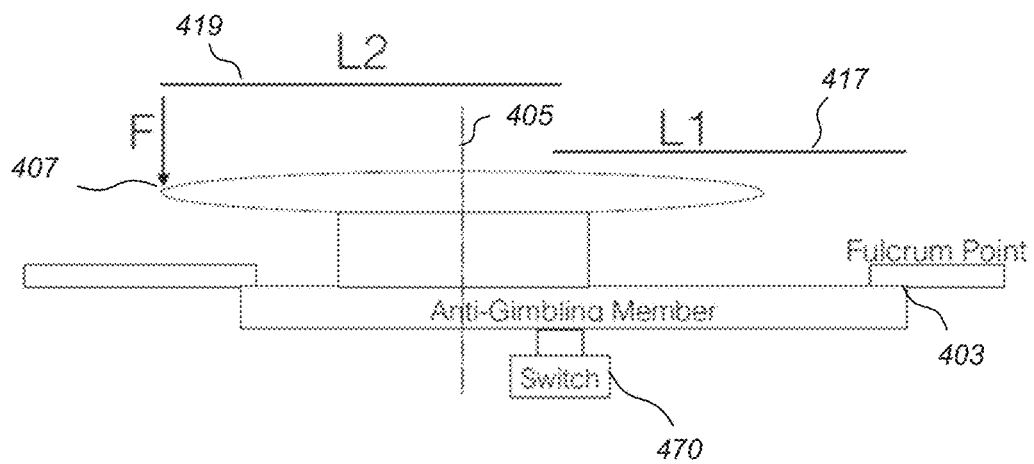

FIG. 6E illustrates that a distance 419 from the switch 470 to the point 407 where the input force F is exerted is approximately L2 and that a distance 417 from the switch 470 to the pivot or fulcrum point 403 is approximately L1.

A ratio of these distances is L2/L1. As can be realized with reference to FIGS. 6C and 6E, the distance from the switch 470 to the input force point 407 varies depending on where the selectable button 404 is contacted due to the off-center or off-axis positioning of the switch 470. Specifically, the distance L2 is greater than the distance L4 due to the positioning of the switch 470. According to the law of the lever, the ratio of input force to output force is provided by the equation below:

$$\frac{F_B}{F_A} = \frac{a}{b}$$

In the above equation, $F_A$ is the input force provided at point A (i.e., where the user presses the selectable button), $F_B$ is the output force provided at point B (i.e., where the displacement control member contacts the switch), a is the distance from the fulcrum to a point A, and b is the distance from the fulcrum point B. In the present example, the output force $F_B$ is equivalent to the force required to activate or trigger the switch 470, which can be assumed to be constant. Applying the above equation to the examples illustrated in FIGS. 6C and 6E, the following two equations are derived:

$$\frac{F_B}{F_A} = \frac{L_2 + L_1}{L_1} = \frac{L_2}{L_1} + 1$$

&

$$\frac{F_B}{F_A} = \frac{L_4 + L_3}{L_3} = \frac{L_4}{L_3} + 1$$

As described herein, one aspect of the displacement control member is the ability to provide a relatively constant or substantially similar input force that is required to activate or trigger the switch 470. Assuming a constant output force required to activate the switch $F_B$ and a constant input force required by the user $F_A$, the two equations above may be rewritten as below:

$$\frac{L_2}{L_1} + 1 = \frac{L_4}{L_3} + 1$$

or more simply $$\frac{L_2}{L_1} = \frac{L_4}{L_3}$$

Stated more simply, the above equation provides that in order to achieve a constant or substantially similar input force that is required to activate or trigger the switch regardless of where the user contacts and presses on the selectable button's surface, the ratio L2/L1 needs to be roughly equal to the ratio L4/L3. The configuration of the displacement control member described herein where the pivot or fulcrum point varies with respect to the switch 470 compensates for the varying switch to input force distances—e.g., L2 and L4. Specifically, the displacement control member is configured so that the ratio L2/L1 is substantially the same as the ratio L4/L3 (e.g., L2/L1≈L4/L3). As such, the input force F required to activate the switch 470 is substantially the same regardless of where the user contacts and presses on the selectable button's surface.

The term "substantially equal" or "substantially the same" as used herein means that it is understood that some acceptable variation in the ratios is expected or anticipated and is meant to capture these instances. For example, the acceptable or anticipated variation of the ratios may be about 50% or less and more commonly about 40% or 30% or less. In some instance, the acceptable or anticipated variation of the ratios may be about 20% or less, and in ideal instances would be about 10% or less. In one embodiment the ratio of the distance from the switch to the user input force and from the switch to the fulcrum or pivot point is between about 3:1 and 1:3, and more commonly between about 3:2 and 2:3.

Figure 4D:
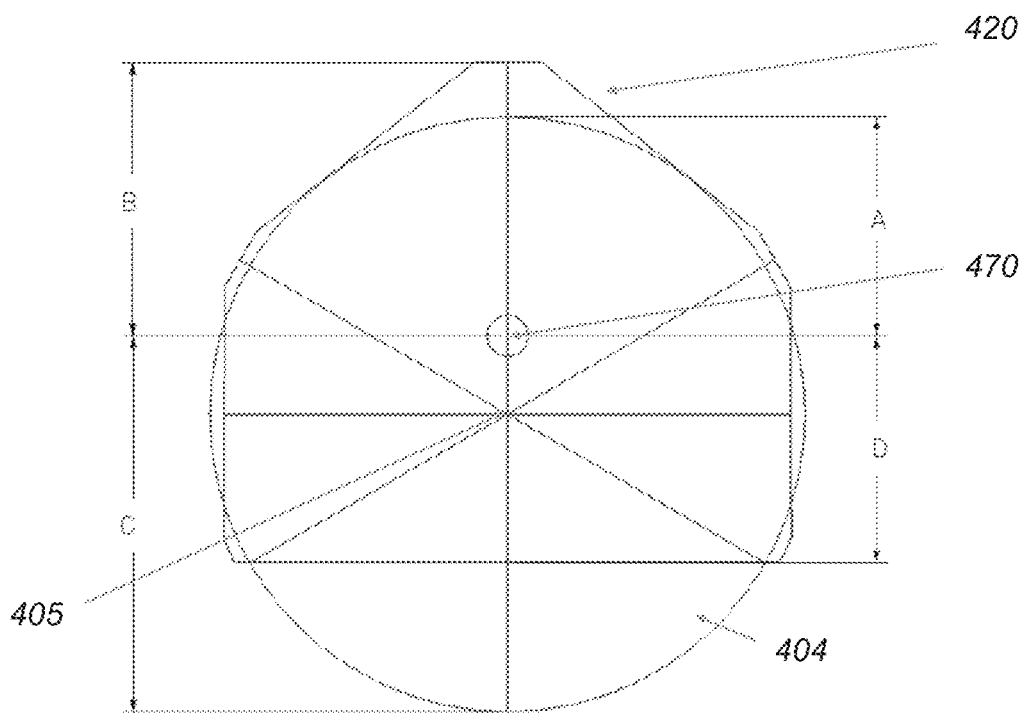

As briefly described above, the displacement control member greatly reduces the deviation or variation in the input force that is required to activate the switch regardless of where the user contacts and presses on the selectable button. The displacement control member may render the input force variation or deviation to less than 40% and more commonly less than 30% or 25%. In a specific embodiment, the input force variation or deviation is less than 20%. For example, referring now to FIGS. 4C and 4D, illustrated is a representation of a displacement control member that includes a radial flange (i.e., FIG. 4C) and a representation of a displacement control member that includes a plurality of radially extending arms (i.e., FIG. 4D). The points A, B, C, and D correspond to an upper push or selection point A on the selectable button 404 and a corresponding lower pivot point D on the displacement control member, and to a lower push or selection point C on the selectable button 404 and a corresponding upper pivot point B on the displacement control member. The position of points A, B, C, and D were determined and the force that would be required to activate the switch was also determined. These values are provided in Table 1 below.

TABLE 1

|  | Radial Flange | 5 Arm Implementation |
| --- | --- | --- |
| Top Push (A) | 19.95 | 19.95 |
| Top Pivot (B) | 35 | 24.85 |
| Bottom Push [C] | 34.25 | 34.25 |
| Bototm Pivot (D) | 20.39 | 20.63 |
| Top Force Multi | 2.02 | 2.03 |
| Bottom Force Multi | 2.02 | 1.73 |
| Input Force Delta | 1.00 | 1.18 |

As can be seen from Table 1, the displacement control member that uses the radial flange results in a substantially similar ratio of the push point and pivot point, which results in a nearly uniform input force being required to activate the switch (i.e., a top force multiplier of 2.02 and a bottom force multiplier of 2.02, which results in an input force delta or difference of 1). In contrast, the displacement control member that uses the 5 radially extending arms results in a push point/pivot point ratio that is slightly less uniform than the radial flange. As a result, the input force that is required to activate the switch is slightly non-uniform with the top input force being roughly 18% greater than the bottom input force (i.e., a top force multiplier of 2.03 and a bottom force multiplier of 1.73, which results in an input force delta or difference of 1.18). This slightly deviation in input force (i.e., 18%) is very minor and with the acceptable range. For example, if the selectable button were used alone, or if a completely circular member were used to control the displacement of the button, the variation of the input force would be greater than 75%—i.e., the upper/top input force multiplier would be 75% greater than the lower/bottom input force multiplier resulting in an input force delta of 1.75 or greater. The top and bottom force multiplier is the force gain due to the lever arm or, stated differently, the mechanical advantage (i.e., multiplication of the force) that is achieved via the lever arm that is created or defined by the displacement control member.

Figure 7A:
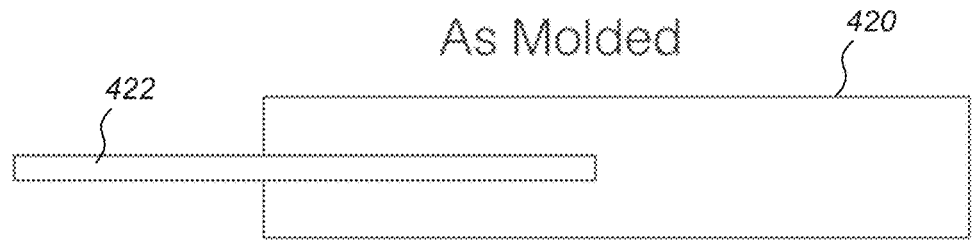
FIGS. 7A-C illustrate an assembly of the displacement control member and spring members.
Figure 7B:
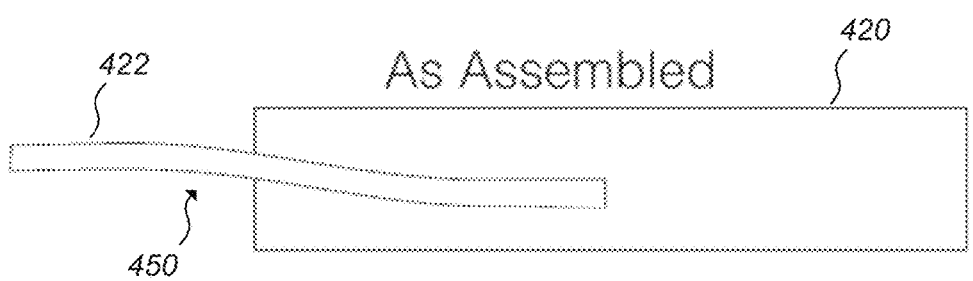
Figure 7C:
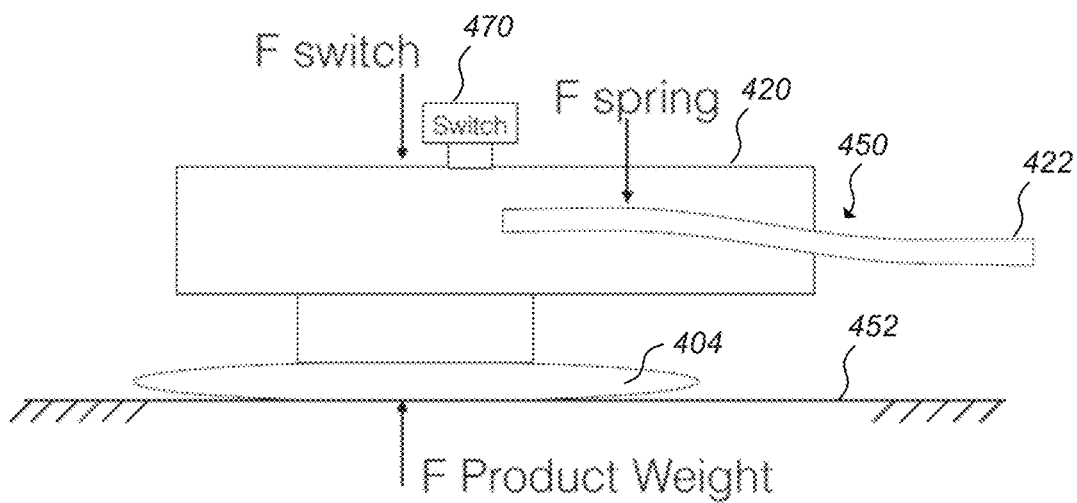

FIGS. 7A-7C illustrate the assembly of the displacement control member 420 and the spring members 422. As shown in FIG. 7A, the displacement control member 420 is molded so that the spring member 422 protrudes roughly straight or orthogonally from the displacement control member's body. As shown in FIG. 7B, when coupled with the inner surface of the chassis (not shown), the distal end of the spring member 422 is deflected upward, which causes the spring's body 450 between the distal and proximal end to flex or bend. The flexed body 450 of spring member 422 creates a spring force that biases the spring member 422 and displacement control member 420 upward and against the inner surface of the chassis. As such, the pivot surface or arms 424 are pressed into constant contact with the inner surface of the chassis, thereby allowing the pivot surface or arms 424 to function as fulcrum or pivot points.

FIG. 7C illustrates that the spring force $F_{spring}$ of spring member 422 and a spring force $F_{switch}$ provided by the switch 470 may be equivalent to or greater than the weight of the smoke detector 400. Stated differently, $F_{product\ weight} \leq F_{spring} + F_{switch}$. This may be important when the smoke detector 400 is placed upside down on a surface 452 with the selectable button 404 supporting all or a majority of the smoke detector's weight. Because the force of the spring and the force of the switch are greater than the product's weight, positioning the smoke detector 400 upside down in this manner will ensure that the weight of the product does not accidentally activate or trigger the switch 470. Stated differently, the force of the spring and the force of the switch are sufficient to support the weight of the smoke detector 400 when the smoke detector 400 is positioned upside down on a surface 452 without activating or triggering the switch 470.

Referring now to FIGS. 8A-9C, illustrated is a representative set of force displacement graphs, or stated differently a graph showing the force required for a given displacement of the switch. Each graph represents a force input (vertical axis) and a corresponding displacement of a component (horizontal axis). The graphs provide information about a "click ratio" of a switch, or stated differently about a "snap feeling" of the switch.

Figure 8A:
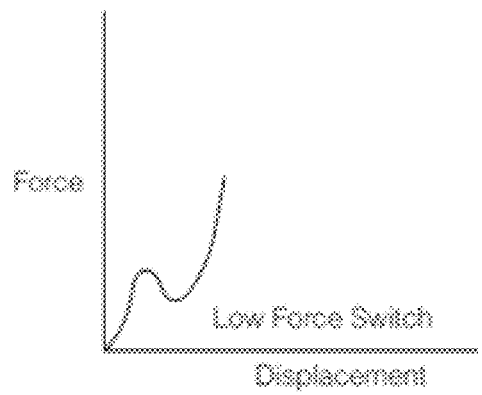
FIGS. 8A-9C illustrate representative displacement graphs showing a force required for a given displacement of the hazard detector's switch.

FIG. 8A illustrates the displacement response of a switch (e.g., switch 470) in response to an input force. The switch has a low force spring constant. The peak of FIG. 8A represent the maximum force and displacement required to cause the switch to trigger or activate. The valley illustrated in FIG. 8A represents the force required to hold or maintain the switch in the triggered or activated position, which is less than the force required to activate the switch. The "click ratio" or "snap feeling" of the switch is indicated by the difference between the peak and valley. The "click ratio" or "snap feeling" provides tactile feedback to a user. A larger peak and valley difference in a graph results in a greater tactile feedback experience. After the switch is triggered, the input force can be increased (e.g., the selectable button 404 can be pressed with more force), but the additional force will not cause substantial or any additional displacement of the switch, which causes the slope to become essentially infinite.

Figure 8B:
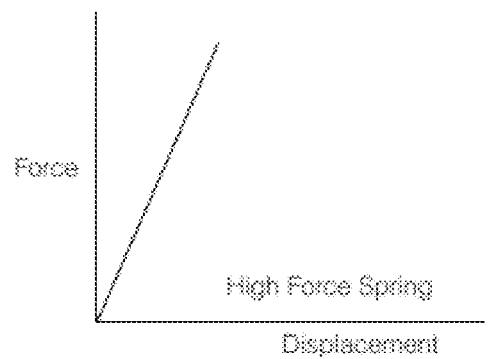
Figure 8C:
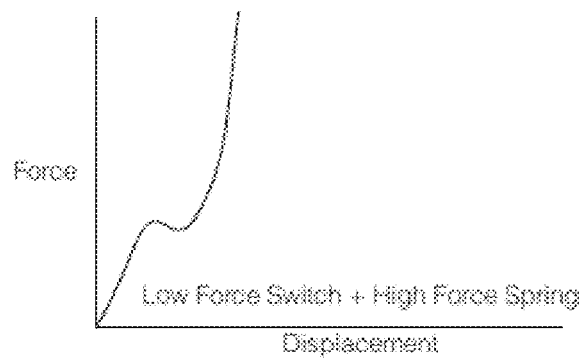

FIG. 8B illustrates the force-displacement response of a high force linear spring, such as spring member 422. FIG. 8B illustrates roughly linear displacement of the high force spring in response to increased force. As illustrated, the force-displacement slope is very steep. FIG. 8C illustrates the superposition of the graphs of the low force switch (i.e., FIG. 8A) and the high force spring (i.e., 8B). FIG. 8C illustrates that the click ratio or snap feeling of the switch is reduced because of the strong force added by the high force spring. The high force spring substantially reduces the peak and valley difference of the graph, which results in less tactile feedback and a typically less desirable click feel. Stated differently, the high force spring washes out the peak and valley difference of the graph, which results in a less desirable tactile click feel.

Figure 9A:
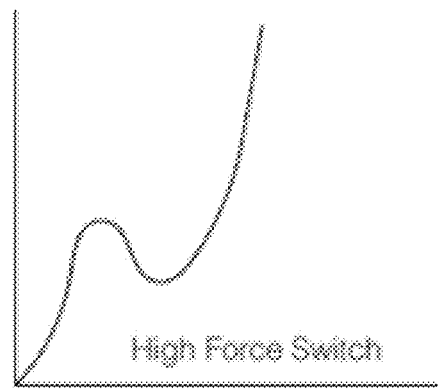
Figure 9B:
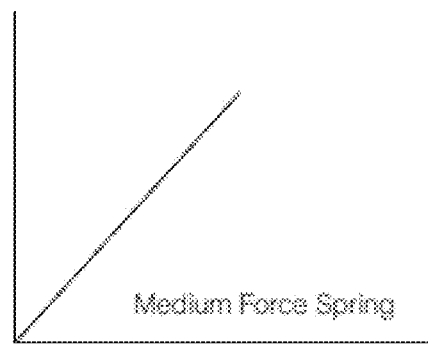
Figure 9C:
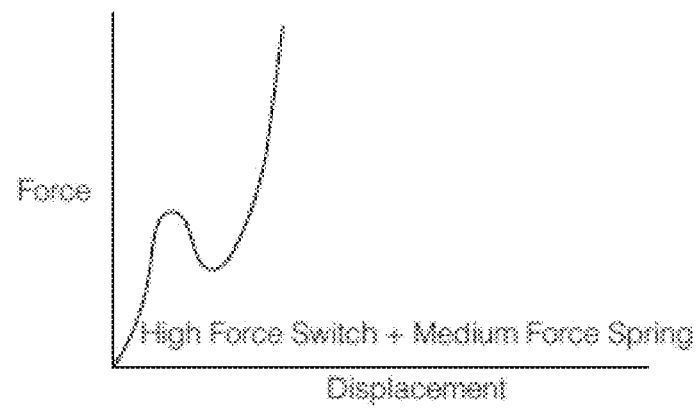

FIG. 9A illustrates the displacement response of a switch having a high force spring constant. As illustrated, the high force spring has a greater peak and valley difference and thus, a greater "click ratio" or "snap feeling". FIG. 9B illustrates the force-displacement response of a medium force linear spring. As illustrated, the force-displacement slope is significantly less steep than the high force spring of FIG. 8B. FIG. 9C illustrates the superposition of the graphs of the high force switch (i.e., FIG. 9A) and the medium force spring (i.e., 9B). FIG. 9C illustrates that while the click ratio or snap feeling of the switch may be reduced because of the medium force spring, any reduction in the click ratio or snap feeling is far less significant than that experience by the combination of the low force switch and high force spring. Accordingly, the click ratio or snap feeling is substantially maintained by the combination of the high force switch and medium force spring, which ensures that a more desirable tactile feedback and click feel is maintained for the switch.

A numerical example of the above scenarios is provided below where the combination of the switch force and spring force results in a 30 N activation force. In a first instance, a low force switch having an activation force of 10 newtons (i.e., peak of FIG. 8A) and a maintenance force of 5 newtons (i.e., valley of FIG. 8A) is used. The switch has roughly a click ratio is 50% (i.e., 5 N/10 N). A high force spring having a constant spring force of 20 newtons is combined with the switch. The combined spring and switch results in an activation force of 30 N (i.e., 10 N from the switch and 20 N from the spring) and a maintenance force of 25 N (i.e., 5 N from the switch and 20 N from the spring). The click ratio of the combined system is approximately 17% (i.e., 5 N/30 N), which is a substantial reduction of the click ratio of the switch alone (i.e., 50%).

In a second instance, a high force switch having an activation force of 20 N (i.e., peak of FIG. 9A) and a maintenance force of 10 N (i.e., valley of FIG. 9A) is used, resulting in a click ratio is 50% (i.e., 10 N/20 N). A medium force spring having a constant spring force of 10 N is combined with the switch. The combined spring and switch results in an activation force of 30 N (i.e., 20 N from the switch and 10 N from the spring) and a maintenance force of 20 N (i.e., 10 N from both the switch and spring). The click ratio of the combined system is approximately 33% (i.e., 10 N/30 N), which is lower than the click ratio of the switch alone (i.e., 50%), but essentially twice as much as the combined lower force switch and high force spring. As such, the tactile feel of the high force switch and medium force spring system is substantially greater than the tactile feel provided by the low force switch and high force spring.

Having described several embodiments, it will be recognized by those of skill in the art that various modifications, alternative constructions, and equivalents may be used without departing from the spirit of the invention. Additionally, a number of well-known processes and elements have not been described in order to avoid unnecessarily obscuring the present invention. Accordingly, the above description should not be taken as limiting the scope of the invention.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the device" includes reference to one or more devices and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

What is claimed is:

1. A device comprising:
   a housing having an interior region within which components of the device are contained;
   a selectable button positioned on a front portion of the device so as to face and be selectable by a user;
   a switch disposed within the housing and axially under the selectable button, the switch being positioned radially offset from a central axis of the selectable button and being activatable upon user selection of the selectable button; and
   a displacement control member disposed within the housing between the selectable button and the switch, the displacement control member being operationally coupled with the selectable button so that axial depression of the selectable button effects pivoting of the selectable button and pivoting of the displacement control member into contact with the switch, the displacement control member being configured to equalize a user input force that is required to activate the switch by being coupled with the housing and selectable button so that a ratio of a radial distance from the switch to the user input force and a radial distance from the switch to a pivot point of the displacement control member is relatively uniform regardless of where the user selects the selectable button;
   wherein the displacement control member includes a centrally located aperture that is positioned so as to not impede a sensor that is disposed axially behind the displacement control member.

2. The device of claim 1, wherein the displacement control member includes a pivot surface that defines the pivot point and that effects pivoting of the selectable button and the displacement control member upon user selection of the selectable button.

3. The device of claim 2, wherein the pivot surface comprises a radial flange that extends around a majority of an outer perimeter of the displacement control member.

4. The device of claim 2, wherein the displacement control member is coupled with the housing so that the pivot surface is radially offset from the central axis of the selectable button.

5. The device of claim 1, wherein a variation of the user input force that is required to activate the switch is less than 25%.

6. The device of claim 1, wherein the displacement control member includes a plurality of arms that extend radially from a central hub, and wherein a radial length of at least two of the arms is different.

7. The device of claim 1, wherein the displacement control member further includes a plurality of spring components that are coupleable with the housing and configured to bias the selectable button toward an unselected position.

8. The device of claim 6, wherein the displacement control member includes five arms that extend radially from the central hub.

9. A component for a device having a selectable button and a switch disposed axially under the selectable button, the switch being positioned radially offset from a central axis of the selectable button and being activatable upon user selection of the selectable button, the component being disposed within the housing between the selectable button and the switch, the component comprising:
a displacement control member that is operationally coupleable with the selectable button so that axial depression of the selectable button effects pivoting of the selectable button and pivoting of the displacement control member into contact with the switch, the displacement control member being coupled with the housing and selectable button so that a ratio of a radial distance from the switch to a point of user contact with the selectable button and a radial distance from the switch to a pivot point of the displacement control member is such that a user input force that is required to activate the switch is relatively uniform regardless of where the user contacts the selectable button;
wherein the displacement control member includes a pivot surface that defines the pivot point that effects pivoting of the selectable button and the displacement control member upon user selection of the selectable button, the pivot surface being defined by a plurality of arms that extend radially from a central hub, wherein a radial length of at least two of the arms is different.

10. The component of claim 9, wherein the displacement control member includes five arms that extend radially from the central hub.

11. The component of claim 9, wherein the displacement control member is coupled with the housing so that the pivot surface is radially offset from the central axis of the selectable button.

12. The component of claim 9, wherein a variation of the user input force that is required to activate the switch is less than 25%.

13. A method of configuring a device comprising:
providing a housing having an interior region within which components of the device are contained;
positioning a selectable button on a front portion of the device so as to face and be selectable by a user;
positioning a switch within the housing so as to be axially under the selectable button and radially offset from a central axis of the selectable button, the switch being activatable upon user selection of the selectable button;
positioning a displacement control member within the housing between the selectable button and the switch; and
coupling the displacement control member with the housing and selectable button so that axial depression of the selectable button effects pivoting of the selectable button and pivoting of the displacement control member into contact with the switch and so that a ratio of a radial distance from the switch to a point of user contact with the selectable button and a radial distance from the switch to a pivot point of the displacement control member is such that a user input force that is required to activate the switch is relatively uniform regardless of where the user contacts the selectable button;
wherein the displacement control member includes a plurality of arms that extend radially from a central hub.

14. The method of claim 13, wherein a radial length of at least two of the arms is different.

15. The method of claim 13, further comprising coupling the displacement control member with the housing so that a pivot surface of the displacement control member is radially offset from the central axis of the selectable button, the pivot surface defining the pivot point that effects pivoting of the selectable button and the displacement control member upon user selection of the selectable button.

* * * * *